United States Patent
Xu et al.

(10) Patent No.: US 10,944,189 B2
(45) Date of Patent: Mar. 9, 2021

(54) HIGH SPEED ELECTRICAL CONNECTOR AND PRINTED CIRCUIT BOARD THEREOF

(71) Applicant: Amphenol East Asia Electronic Technology (Shenzhen) Co., Ltd., Guangdong (CN)

(72) Inventors: Qigui Xu, Shenzhen (CN); E Zhao, Shenzhen (CN); Zhigang Sheng, Shenzhen (CN); Shengxian Zhou, Shenzhen (CN)

(73) Assignee: Amphenol East Asia Electronic Technology (Shenzhen) Co., Ltd., Shenzhen (CN)

( * ) Notice: Subject to any disclaimer, the term of this patent is extended or adjusted under 35 U.S.C. 154(b) by 0 days.

(21) Appl. No.: 16/415,456

(22) Filed: May 17, 2019

(65) Prior Publication Data

US 2020/0099149 A1    Mar. 26, 2020

(30) Foreign Application Priority Data

Sep. 26, 2018 (CN) .......................... 201821577530.2

(51) Int. Cl.
*H01R 12/00* (2006.01)
*H01R 12/57* (2011.01)
(Continued)

(52) U.S. Cl.
CPC .......... *H01R 12/57* (2013.01); *H01R 12/515* (2013.01); *H01R 12/53* (2013.01); *H01R 12/716* (2013.01);
(Continued)

(58) Field of Classification Search
CPC . H01R 23/7073; H01R 23/688; H01R 13/514
(Continued)

(56) References Cited

U.S. PATENT DOCUMENTS 1,012,229 A  *  12/1911  Wilson ................... A45D 40/02
                                                                    401/81
2,996,710 A       8/1961  Pratt
(Continued)

FOREIGN PATENT DOCUMENTS

CN        2519434 Y     10/2002
CN        1179448 C     12/2004
(Continued)

OTHER PUBLICATIONS

Chinese Office Action for CN 201180033750.3 dated Aug. 13, 2014.
(Continued)

*Primary Examiner* — Thanh Tam T Le
(74) *Attorney, Agent, or Firm* — Wolf, Greenfield & Sacks, P.C.

(57) ABSTRACT

A stacked I/O connector with surface mountable tails and a printed circuit board (PCB) configured to receive the connector. The connector may avoid terminal deformations or scratches when the connector is mounted to the PCB. The PCB may include solder pads on a single surface or both surfaces. The sold pads may be configured for the tails of the connector to be attached with a surface mount soldering technique. As a result, the connector has high density and high speed, requires, requires a smaller mounting area on a PCB, relaxes the limitations in routing PCB traces, and reduces the electrical performance deterioration caused by PCB trace routing limitations. The connector may have row-oriented terminal subassemblies, holes in the connector housing and other features to facilitate reliable manufacture and operation of the connector.

21 Claims, 8 Drawing Sheets

(51) Int. Cl.
  *H05K 1/18* (2006.01)
  *H01R 13/6461* (2011.01)
  *H01R 12/53* (2011.01)
  *H01R 12/71* (2011.01)
  *H01R 12/75* (2011.01)
  *H01R 12/51* (2011.01)

(52) U.S. Cl.
  CPC ......... *H01R 12/75* (2013.01); *H01R 13/6461* (2013.01); *H05K 1/184* (2013.01); *H05K 2201/10189* (2013.01)

(58) Field of Classification Search
  USPC .................. 439/79, 108, 541.5, 607.11, 701
  See application file for complete search history.

(56) References Cited

U.S. PATENT DOCUMENTS

| | | |
|---|---|---|
| 3,002,162 A | 9/1961 | Garstang |
| 3,134,950 A | 5/1964 | Cook |
| 3,322,885 A | 5/1967 | May et al. |
| 3,786,372 A | 1/1974 | Epis et al. |
| 3,825,874 A | 7/1974 | Peverill |
| 3,863,181 A | 1/1975 | Glance et al. |
| 4,155,613 A | 5/1979 | Brandeau |
| 4,195,272 A | 3/1980 | Boutros |
| 4,276,523 A | 6/1981 | Boutros et al. |
| 4,371,742 A | 2/1983 | Manly |
| 4,408,255 A | 10/1983 | Adkins |
| 4,447,105 A | 5/1984 | Ruehl |
| 4,471,015 A | 9/1984 | Ebneth et al. |
| 4,484,159 A | 11/1984 | Whitley |
| 4,490,283 A | 12/1984 | Kleiner |
| 4,518,651 A | 5/1985 | Wolfe, Jr. |
| 4,519,664 A | 5/1985 | Tillotson |
| 4,519,665 A | 5/1985 | Althouse et al. |
| 4,632,476 A | 12/1986 | Schell |
| 4,636,752 A | 1/1987 | Saito |
| 4,682,129 A | 7/1987 | Bakermans et al. |
| 4,751,479 A | 6/1988 | Parr |
| 4,761,147 A | 8/1988 | Gauthier |
| 4,806,107 A | 2/1989 | Arnold et al. |
| 4,846,724 A | 7/1989 | Sasaki et al. |
| 4,846,727 A | 7/1989 | Glover et al. |
| 4,878,155 A | 10/1989 | Conley |
| 4,948,922 A | 8/1990 | Varadan et al. |
| 4,970,354 A | 11/1990 | Iwasa et al. |
| 4,975,084 A | 12/1990 | Fedder et al. |
| 4,992,060 A | 2/1991 | Meyer |
| 5,000,700 A | 3/1991 | Masubuchi et al. |
| 5,066,236 A | 11/1991 | Broeksteeg |
| 5,141,454 A | 8/1992 | Garrett et al. |
| 5,150,086 A | 9/1992 | Ito |
| 5,166,527 A | 11/1992 | Solymar |
| 5,167,531 A * | 12/1992 | Broschard, III ..... H01R 13/658 439/541.5 |
| 5,168,252 A | 12/1992 | Naito |
| 5,168,432 A | 12/1992 | Murphy et al. |
| 5,176,538 A | 1/1993 | Hansell, III et al. |
| 5,266,055 A | 11/1993 | Naito et al. |
| 5,280,257 A | 1/1994 | Cravens et al. |
| 5,281,152 A * | 1/1994 | Takahashi ............ H05K 3/3426 439/79 |
| 5,287,076 A | 2/1994 | Johnescu et al. |
| 5,318,463 A * | 6/1994 | Broschard, III ... H01R 13/6453 439/541.5 |
| 5,334,050 A | 8/1994 | Andrews |
| 5,336,109 A * | 8/1994 | Hillbish ............... H01R 12/724 439/541.5 |
| 5,340,334 A | 8/1994 | Nguyen |
| 5,346,410 A | 9/1994 | Moore, Jr. |
| 5,429,520 A | 7/1995 | Morlion et al. |
| 5,429,521 A | 7/1995 | Morlion et al. |
| 5,433,617 A | 7/1995 | Morlion et al. |
| 5,433,618 A | 7/1995 | Morlion et al. |
| 5,453,016 A * | 9/1995 | Clark .................. H01R 43/205 439/79 |
| 5,456,619 A | 10/1995 | Belopolsky et al. |
| 5,461,392 A | 10/1995 | Mott et al. |
| 5,474,472 A | 12/1995 | Niwa et al. |
| 5,484,310 A | 1/1996 | McNamara et al. |
| 5,496,183 A | 3/1996 | Soes et al. |
| 5,499,935 A | 3/1996 | Powell |
| 5,551,893 A | 9/1996 | Johnson |
| 5,562,497 A | 10/1996 | Yagi et al. |
| 5,597,328 A | 1/1997 | Mouissie |
| 5,651,702 A | 7/1997 | Hanning et al. |
| 5,669,789 A | 9/1997 | Law |
| 5,786,986 A | 7/1998 | Bregman et al. |
| 5,796,323 A | 8/1998 | Uchikoba et al. |
| 5,831,491 A | 11/1998 | Buer et al. |
| 5,848,914 A | 12/1998 | Lang et al. |
| 5,924,899 A | 7/1999 | Paagman |
| 5,981,869 A | 11/1999 | Kroger |
| 5,982,253 A | 11/1999 | Perrin et al. |
| 6,019,616 A | 2/2000 | Yagi et al. |
| 6,152,747 A | 11/2000 | McNamara |
| 6,159,040 A * | 12/2000 | Chang .................. H01R 12/716 439/541.5 |
| 6,168,469 B1 | 1/2001 | Lu |
| 6,174,202 B1 | 1/2001 | Mitra |
| 6,174,203 B1 | 1/2001 | Asao |
| 6,174,944 B1 | 1/2001 | Chiba et al. |
| 6,217,372 B1 | 4/2001 | Reed |
| 6,293,827 B1 | 9/2001 | Stokoe |
| 6,296,496 B1 | 10/2001 | Trammel |
| 6,299,438 B1 | 10/2001 | Sahagian et al. |
| 6,299,483 B1 | 10/2001 | Cohen et al. |
| 6,328,601 B1 | 12/2001 | Yip et al. |
| 6,347,962 B1 | 2/2002 | Kline |
| 6,350,134 B1 | 2/2002 | Fogg et al. |
| 6,364,711 B1 | 4/2002 | Berg et al. |
| 6,375,510 B2 | 4/2002 | Asao |
| 6,379,188 B1 | 4/2002 | Cohen et al. |
| 6,398,588 B1 | 6/2002 | Bickford |
| 6,409,543 B1 | 6/2002 | Astbury, Jr. et al. |
| 6,482,017 B1 | 11/2002 | Van Doorn |
| 6,503,103 B1 | 1/2003 | Cohen et al. |
| 6,506,076 B2 | 1/2003 | Cohen et al. |
| 6,517,360 B1 | 2/2003 | Cohen |
| 6,530,790 B1 | 3/2003 | McNamara et al. |
| 6,537,087 B2 | 3/2003 | McNamara et al. |
| 6,554,647 B1 | 4/2003 | Cohen et al. |
| 6,561,847 B1 | 5/2003 | Xiang et al. |
| 6,565,387 B2 | 5/2003 | Cohen |
| 6,579,116 B2 | 6/2003 | Brennan et al. |
| 6,582,244 B2 | 6/2003 | Fogg et al. |
| 6,589,061 B1 * | 7/2003 | Korsunsky ............. H05K 1/117 439/79 |
| 6,595,802 B1 | 7/2003 | Watanabe et al. |
| 6,600,865 B2 | 7/2003 | Hwang |
| 6,602,095 B2 | 8/2003 | Astbury, Jr. et al. |
| 6,616,864 B1 | 9/2003 | Jiang et al. |
| 6,652,318 B1 | 11/2003 | Winings et al. |
| 6,655,966 B2 | 12/2003 | Rothermel et al. |
| 6,692,231 B1 | 2/2004 | Calvert |
| 6,709,294 B1 | 3/2004 | Cohen et al. |
| 6,713,672 B1 | 3/2004 | Stickney |
| 6,743,057 B2 | 6/2004 | Davis et al. |
| 6,776,659 B1 | 8/2004 | Stokoe et al. |
| 6,786,771 B2 | 9/2004 | Gailus |
| 6,814,619 B1 | 11/2004 | Stokoe et al. |
| 6,830,489 B2 | 12/2004 | Aoyama |
| 6,872,085 B1 | 3/2005 | Cohen et al. |
| 6,979,226 B2 | 12/2005 | Otsu et al. |
| 7,044,794 B2 | 5/2006 | Consoli et al. |
| 7,057,570 B2 | 6/2006 | Irion, II et al. |
| 7,074,086 B2 | 7/2006 | Cohen et al. |
| 7,094,102 B2 | 8/2006 | Cohen et al. |
| 7,108,556 B2 | 9/2006 | Cohen et al. |
| 7,163,421 B1 | 1/2007 | Cohen et al. |
| 7,214,074 B2 * | 5/2007 | Osada .................. H01R 12/712 439/79 |

(56) References Cited

U.S. PATENT DOCUMENTS

| | | |
|---|---|---|
| 7,258,573 B1* | 8/2007 | Lee .................. H01R 12/716 439/541.5 |
| 7,285,018 B2 | 10/2007 | Kenny et al. |
| 7,331,830 B2 | 2/2008 | Minich |
| 7,335,063 B2 | 2/2008 | Cohen et al. |
| 7,354,274 B2 | 4/2008 | Minich |
| 7,407,413 B2 | 8/2008 | Minich |
| 7,494,383 B2 | 2/2009 | Cohen et al. |
| 7,540,781 B2 | 6/2009 | Kenny et al. |
| 7,581,990 B2 | 9/2009 | Kirk et al. |
| 7,588,464 B2 | 9/2009 | Kim |
| 7,604,502 B2 | 10/2009 | Pan |
| 7,690,946 B2 | 4/2010 | Knaub et al. |
| 7,722,401 B2 | 5/2010 | Kirk et al. |
| 7,731,537 B2 | 6/2010 | Amleshi et al. |
| 7,753,731 B2 | 7/2010 | Cohen et al. |
| 7,771,233 B2 | 8/2010 | Gailus |
| 7,789,676 B2 | 9/2010 | Morgan et al. |
| 7,794,240 B2 | 9/2010 | Cohen et al. |
| 7,794,278 B2* | 9/2010 | Cohen .................. H01R 12/727 439/108 |
| 7,806,729 B2 | 10/2010 | Nguyen et al. |
| 7,871,296 B2 | 1/2011 | Fowler et al. |
| 7,874,873 B2 | 1/2011 | Do et al. |
| 7,887,371 B2 | 2/2011 | Kenny et al. |
| 7,887,379 B2 | 2/2011 | Kirk |
| 7,896,659 B1 | 3/2011 | Westman et al. |
| 7,906,730 B2 | 3/2011 | Atkinson et al. |
| 7,914,304 B2 | 3/2011 | Cartier et al. |
| 7,985,097 B2 | 7/2011 | Gulla |
| 8,018,733 B2 | 9/2011 | Jia |
| 8,057,267 B2 | 11/2011 | Johnescu |
| 8,083,553 B2 | 12/2011 | Manter et al. |
| 8,182,289 B2 | 5/2012 | Stokoe et al. |
| 8,215,968 B2 | 7/2012 | Cartier et al. |
| 8,216,001 B2 | 7/2012 | Kirk |
| 8,251,745 B2 | 8/2012 | Johnescu et al. |
| 8,272,877 B2 | 9/2012 | Stokoe et al. |
| 8,371,875 B2 | 2/2013 | Gailus |
| 8,382,524 B2 | 2/2013 | Khilchenko et al. |
| 8,480,413 B2* | 7/2013 | Minich .................. H01R 12/724 439/607.05 |
| 8,540,525 B2* | 9/2013 | Regnier .................. H01R 29/00 439/79 |
| 8,550,861 B2 | 10/2013 | Cohen et al. |
| 8,657,627 B2 | 2/2014 | McNamara et al. |
| 8,678,860 B2 | 3/2014 | Minich et al. |
| 8,715,003 B2 | 5/2014 | Buck et al. |
| 8,715,005 B2 | 5/2014 | Pan |
| 8,771,016 B2 | 7/2014 | Atkinson et al. |
| 8,864,521 B2 | 10/2014 | Atkinson et al. |
| 8,926,377 B2 | 1/2015 | Kirk et al. |
| 8,944,831 B2 | 2/2015 | Stoner et al. |
| 8,998,642 B2 | 4/2015 | Manter et al. |
| 9,004,942 B2 | 4/2015 | Paniauqa |
| 9,011,177 B2 | 4/2015 | Lloyd et al. |
| 9,022,806 B2 | 5/2015 | Cartier, Jr. et al. |
| 9,028,281 B2* | 5/2015 | Kirk .................. H01R 12/724 439/701 |
| 9,065,230 B2 | 6/2015 | Milbrand, Jr. |
| 9,124,009 B2 | 9/2015 | Atkinson et al. |
| 9,219,335 B2 | 12/2015 | Atkinson et al. |
| 9,225,085 B2 | 12/2015 | Cartier, Jr. et al. |
| 9,257,794 B2 | 2/2016 | Wanha et al. |
| 9,300,074 B2 | 3/2016 | Gailus |
| 9,450,344 B2 | 9/2016 | Cartier, Jr. et al. |
| 9,484,674 B2 | 11/2016 | Cartier, Jr. et al. |
| 9,509,101 B2 | 11/2016 | Cartier, Jr. et al. |
| 9,520,689 B2 | 12/2016 | Cartier, Jr. et al. |
| 9,666,998 B1* | 5/2017 | de Boer .................. H01R 13/6599 |
| 9,705,255 B2 | 7/2017 | Atkinson et al. |
| 9,843,135 B2 | 12/2017 | Guetig et al. |
| 9,859,658 B2* | 1/2018 | Champion .................. H01R 13/6471 |
| 9,915,560 B2 | 3/2018 | Ho et al. |
| 10,122,129 B2 | 11/2018 | Milbrand, Jr. et al. |
| 10,153,571 B2 | 12/2018 | Kachlic |
| 10,211,577 B2 | 2/2019 | Milbrand, Jr. et al. |
| 10,243,304 B2 | 3/2019 | Kirk et al. |
| 10,348,040 B2 | 7/2019 | Cartier et al. |
| 10,381,767 B1 | 8/2019 | Milbrand, Jr. et al. |
| 10,431,936 B2 | 10/2019 | Horning et al. |
| 10,511,128 B2 | 12/2019 | Kirk et al. |
| 10,588,243 B2 | 3/2020 | Little et al. |
| 10,630,002 B2* | 4/2020 | Huang .................. H01R 12/724 |
| 10,630,010 B2* | 4/2020 | Tracy .................. H01R 12/707 |
| 2001/0042632 A1 | 11/2001 | Manov et al. |
| 2002/0042223 A1 | 4/2002 | Belopolsky et al. |
| 2002/0089464 A1 | 7/2002 | Joshi |
| 2002/0098738 A1 | 7/2002 | Astbury et al. |
| 2002/0111068 A1 | 8/2002 | Cohen et al. |
| 2002/0111069 A1 | 8/2002 | Astbury et al. |
| 2002/0123266 A1 | 9/2002 | Ramey et al. |
| 2002/0146926 A1 | 10/2002 | Fogg et al. |
| 2004/0005815 A1 | 1/2004 | Mizumura et al. |
| 2004/0020674 A1 | 2/2004 | McFadden et al. |
| 2004/0115968 A1 | 6/2004 | Cohen |
| 2004/0121652 A1 | 6/2004 | Gailus |
| 2004/0166708 A1 | 8/2004 | Kiely |
| 2004/0196112 A1 | 10/2004 | Welbon et al. |
| 2004/0259419 A1 | 12/2004 | Payne et al. |
| 2005/0070160 A1 | 3/2005 | Cohen et al. |
| 2005/0133245 A1 | 6/2005 | Katsuyama et al. |
| 2005/0176835 A1 | 8/2005 | Kobayashi et al. |
| 2005/0233610 A1 | 10/2005 | Tutt et al. |
| 2005/0283974 A1 | 12/2005 | Richard et al. |
| 2005/0287869 A1 | 12/2005 | Kenny et al. |
| 2006/0009080 A1 | 1/2006 | Regnier et al. |
| 2006/0068640 A1 | 3/2006 | Gailus |
| 2006/0255876 A1 | 11/2006 | Kushta et al. |
| 2007/0004282 A1 | 1/2007 | Cohen et al. |
| 2007/0021001 A1 | 1/2007 | Laurx et al. |
| 2007/0037419 A1 | 2/2007 | Sparrowhawk |
| 2007/0042639 A1 | 2/2007 | Manter et al. |
| 2007/0054554 A1 | 3/2007 | Do et al. |
| 2007/0059961 A1 | 3/2007 | Cartier et al. |
| 2007/0155241 A1 | 7/2007 | Lappohn |
| 2007/0218765 A1 | 9/2007 | Cohen et al. |
| 2008/0194146 A1 | 8/2008 | Gailus |
| 2008/0246555 A1 | 10/2008 | Kirk et al. |
| 2008/0248658 A1 | 10/2008 | Cohen et al. |
| 2008/0248659 A1 | 10/2008 | Cohen et al. |
| 2008/0248660 A1 | 10/2008 | Kirk et al. |
| 2008/0318476 A1 | 12/2008 | Weber et al. |
| 2009/0011620 A1 | 1/2009 | Avery et al. |
| 2009/0011641 A1 | 1/2009 | Cohen et al. |
| 2009/0011645 A1 | 1/2009 | Laurx et al. |
| 2009/0035955 A1 | 2/2009 | McNamara |
| 2009/0061661 A1 | 3/2009 | Shuey et al. |
| 2009/0117386 A1 | 5/2009 | Vacanti et al. |
| 2009/0203259 A1 | 8/2009 | Nguyen et al. |
| 2009/0239395 A1 | 9/2009 | Cohen et al. |
| 2009/0258516 A1 | 10/2009 | Hiew et al. |
| 2009/0291593 A1 | 11/2009 | Atkinson et al. |
| 2009/0305533 A1 | 12/2009 | Feldman et al. |
| 2009/0305553 A1 | 12/2009 | Thomas et al. |
| 2010/0048058 A1 | 2/2010 | Morgan et al. |
| 2010/0081302 A1 | 4/2010 | Atkinson et al. |
| 2010/0144167 A1 | 6/2010 | Fedder et al. |
| 2010/0291806 A1 | 11/2010 | Minich et al. |
| 2010/0294530 A1 | 11/2010 | Atkinson et al. |
| 2011/0003509 A1 | 1/2011 | Gailus |
| 2011/0104948 A1 | 5/2011 | Girard, Jr. et al. |
| 2011/0130038 A1 | 6/2011 | Cohen et al. |
| 2011/0212649 A1 | 9/2011 | Stokoe et al. |
| 2011/0212650 A1 | 9/2011 | Amleshi et al. |
| 2011/0230095 A1 | 9/2011 | Atkinson et al. |
| 2011/0230096 A1 | 9/2011 | Atkinson et al. |
| 2011/0256739 A1 | 10/2011 | Toshiyuki et al. |
| 2011/0287663 A1 | 11/2011 | Gailus et al. |
| 2012/0003848 A1 | 1/2012 | Casher et al. |
| 2012/0094536 A1 | 4/2012 | Khilchenko et al. |
| 2012/0156929 A1 | 6/2012 | Manter et al. |
| 2012/0184154 A1 | 7/2012 | Frank et al. |

(56) References Cited

U.S. PATENT DOCUMENTS

| | | |
|---|---|---|
| 2012/0202363 A1 | 8/2012 | McNamara et al. |
| 2012/0202386 A1 | 8/2012 | McNamara et al. |
| 2012/0214344 A1 | 8/2012 | Cohen et al. |
| 2013/0012038 A1 | 1/2013 | Kirk et al. |
| 2013/0017733 A1 | 1/2013 | Kirk et al. |
| 2013/0065454 A1 | 3/2013 | Milbrand, Jr. et al. |
| 2013/0078870 A1 | 3/2013 | Milbrand, Jr. |
| 2013/0078871 A1 | 3/2013 | Milbrand, Jr. |
| 2013/0109232 A1 | 5/2013 | Paniaqua |
| 2013/0143442 A1 | 6/2013 | Cohen et al. |
| 2013/0196553 A1 | 8/2013 | Gailus |
| 2013/0217263 A1 | 8/2013 | Pan |
| 2013/0225006 A1 | 8/2013 | Khilchenko et al. |
| 2013/0316590 A1 | 11/2013 | Fan et al. |
| 2014/0004724 A1 | 1/2014 | Cartier, Jr. et al. |
| 2014/0004726 A1 | 1/2014 | Cartier, Jr. et al. |
| 2014/0004746 A1 | 1/2014 | Cartier, Jr. et al. |
| 2014/0057498 A1 | 2/2014 | Cohen |
| 2014/0273557 A1 | 9/2014 | Cartier, Jr. et al. |
| 2014/0273627 A1 | 9/2014 | Cartier, Jr. et al. |
| 2015/0056856 A1 | 2/2015 | Atkinson et al. |
| 2015/0111427 A1 | 4/2015 | Wu et al. |
| 2015/0236451 A1 | 8/2015 | Cartier, Jr. et al. |
| 2015/0236452 A1 | 8/2015 | Cartier, Jr. et al. |
| 2015/0255926 A1 | 9/2015 | Paniagua |
| 2016/0149343 A1 | 5/2016 | Atkinson et al. |
| 2017/0077643 A1 | 3/2017 | Zbinden et al. |
| 2018/0062323 A1 | 3/2018 | Kirk et al. |
| 2018/0145438 A1 | 5/2018 | Cohen |
| 2018/0219331 A1 | 8/2018 | Cartier et al. |
| 2019/0319395 A1 | 10/2019 | Bakshan et al. |
| 2019/0326703 A1 | 10/2019 | Chen |
| 2019/0334292 A1 | 10/2019 | Cartier et al. |
| 2020/0021052 A1 | 1/2020 | Milbrand, Jr. et al. |
| 2020/0235529 A1 | 7/2020 | Kirk et al. |
| 2020/0266585 A1 | 8/2020 | Paniagua et al. |

FOREIGN PATENT DOCUMENTS

| | | |
|---|---|---|
| CN | 1650479 A | 8/2005 |
| CN | 1799290 A | 7/2006 |
| CN | 2798361 Y | 7/2006 |
| CN | 101176389 A | 5/2008 |
| CN | 101208837 A | 6/2008 |
| CN | 101312275 A | 11/2008 |
| CN | 101600293 A | 12/2009 |
| CN | 101752700 A | 6/2010 |
| CN | 101790818 A | 7/2010 |
| CN | 101120490 B | 11/2010 |
| CN | 201846527 U | 5/2011 |
| CN | 102106041 A | 6/2011 |
| CN | 102232259 A | 11/2011 |
| CN | 102239605 A | 11/2011 |
| CN | 102292881 A | 12/2011 |
| CN | 101600293 B | 5/2012 |
| CN | 102598430 A | 7/2012 |
| CN | 102738621 A | 10/2012 |
| CN | 102859805 A | 1/2013 |
| CN | 202695788 U | 1/2013 |
| CN | 104577577 A | 4/2015 |
| CN | 106099546 A | 11/2016 |
| DE | 60216728 T2 | 11/2007 |
| EP | 0 560 551 A1 | 9/1993 |
| EP | 1 018 784 A1 | 7/2000 |
| EP | 1 779 472 A1 | 5/2007 |
| EP | 2 169 770 A2 | 3/2010 |
| EP | 2 405 537 A1 | 1/2012 |
| GB | 1272347 A | 4/1972 |
| JP | 07302649 A | 11/1995 |
| JP | 2001-510627 A | 7/2001 |
| JP | 2006-344524 A | 12/2006 |
| MX | 9907324 A1 | 8/2000 |
| TW | M357771 U | 5/2009 |
| WO | WO 88/05218 A1 | 7/1988 |
| WO | WO 98/35409 A1 | 8/1998 |
| WO | WO 2004/059794 A2 | 7/2004 |
| WO | WO 2004/059801 A1 | 7/2004 |
| WO | WO 2006/039277 A1 | 4/2006 |
| WO | WO 2007/005597 A2 | 1/2007 |
| WO | WO 2007/005599 A1 | 1/2007 |
| WO | WO 2008/124057 A1 | 10/2008 |
| WO | WO 2010/030622 A1 | 3/2010 |
| WO | WO 2010/039188 A1 | 4/2010 |

OTHER PUBLICATIONS

Chinese communication for Chinese Application No. 201580014851.4, dated Jun. 1, 2020.
Chinese Office Action for Chinese Application No. 201580014851.4 dated Sep. 4, 2019.
Chinese Office Action for Chinese Application No. 201780064531.9 dated Jan. 2, 2020.
Extended European Search Report for European Application No. EP 11166820.8 dated Jan. 24, 2012.
International Preliminary Report on Patentability for International Application No. PCT/US2010/056482 dated May 24, 2012.
International Search Report and Written Opinion for International Application No. PCT/US2010/056482 dated Mar. 14, 2011.
International Preliminary Report on Patentability for International Application No. PCT/US2011/026139 dated Sep. 7, 2012.
International Search Report and Written Opinion for International Application No. PCT/US2011/026139 dated Nov. 22, 2011.
International Preliminary Report on Patentability for International Application No. PCT/US2012/023689 dated Aug. 15, 2013.
International Search Report and Written Opinion for International Application No. PCT/US2012/023689 dated Sep. 12, 2012.
International Search Report and Written Opinion for International Application No. PCT/US2012/060610 dated Mar. 29, 2013.
International Search Report and Written Opinion for International Application No. PCT/US2015/012463 dated May 13, 2015.
International Preliminary Report on Patentability for International Application No. PCT/US2017/047905, dated Mar. 7, 2019.
International Search Report and Written Opinion for International Application No. PCT/US2017/047905 dated Dec. 4, 2017.
International Search Report and Written Opinion for International Application No. PCT/US2005/034605 dated Jan. 26, 2006.
International Search Report and Written Opinion for International Application No. PCT/US2011/034747 dated Jul. 28, 2011.
International Search Report with Written Opinion for International Application No. PCT/US2006/025562 dated Oct. 31, 2007.
[No Author Listed], Carbon Nanotubes for Electromagnetic Interference Shielding. SBIR/STTR. Award Information. Program Year 2001. Fiscal Year 2001. Materials Research Institute, LLC. Chu et al. Available at http://sbir.gov/sbirsearch/detail/225895. Last accessed Sep. 19, 2013.
[No Author Listed], High Speed Backplane Connectors . Tyco Electronics. Product Catalog No. 1773095. Revised Dec. 2008 1-40 pages.
[No Author Listed], Military Fibre Channel High Speed Cable Assembly. www.gore.com. 2008. [last accessed Aug. 2, 2012 via Internet Archive: Wayback Machine http://web.archive.org] Link archived: http://www.gore.com/en.sub.--xx/products/cables/copper/networking/military/military.sub.--fibre . . . Last archive date Apr. 6, 2008.
Beaman, High Performance Mainframe Computer Cables. 1997 Electronic Components and Technology Conference. 1997;911-7.
Reich et al., Microwave Theory and Techniques. Boston Technical Publishers, Inc. 1965;182-91.
Shi et al, Improving Signal Integrity in Circuit Boards by Incorporating Absorbing Materials. 2001 Proceedings. 51st Electronic Components and Technology Conference, Orlando FL. 2001:1451-56.
CN 201180033750.3, dated Aug. 13, 2014, Chinese Office Action.
CN 201580014851.4, dated Sep. 4, 2019, Chinese Office Action.
CN 201580014851.4, dated Jun. 1, 2020, Chinese Communication.
CN 201780064531.9, dated Jan. 2, 2020, Chinese Office Action.
EP 11166820.8, dated Jan. 24, 2012, Extended European Search Report.

(56) References Cited

OTHER PUBLICATIONS

PCT/US2005/034605, dated Jan. 26, 2006, International Search Report and Written Opinion.
PCT/US2006/025562, dated Oct. 31, 2007, International Search Report with Written Opinion.
PCT/US2010/056482, dated Mar. 14, 2011, International Search Report and Written Opinion.
PCT/US2010/056482, dated May 24, 2012, International Preliminary Report on Patentability.
PCT/US2011/026139, dated Nov. 22, 2011, International Search Report and Written Opinion.
PCT/US2011/026139, dated Sep. 7, 2012, International Preliminary Report on Patentability.
PCT/US2011/034747, dated Jul. 28, 2011, International Search Report and Written Opinion.
PCT/US2012/023689, dated Sep. 12, 2012, International Search Report and Written Opinion.
PCT/US2012/023689, dated Aug. 15, 2013, International Preliminary Report on Patentability.
PCT/US2012/060610, dated Mar. 29, 2013, International Search Report and Written Opinion.
PCT/US2015/012463, dated May 13, 2015, International Search Report and Written Opinion.
PCT/US2017/047905, dated Dec. 4, 2017, International Search Report and Written Opinion.
PCT/US2017/047905, dated Mar. 7, 2019, International Preliminary Report on Patentability.

\* cited by examiner

HIGH SPEED ELECTRICAL CONNECTOR AND PRINTED CIRCUIT BOARD THEREOF

CROSS REFERENCE TO RELATED APPLICATIONS

This application claims priority to and the benefit of Chinese Patent Application No. 201821577530.2, filed Sep. 26, 2018, the entire content of which is incorporated herein by reference in its entirety.

FIELD OF THE INVENTION

This disclosure relates generally to electronic systems and more specifically to electrical connectors able to carry high-frequency signals and printed circuit boards thereof.

BACKGROUND

Electrical connectors are used in many electronic systems. In general, various electronic devices (e.g., smart phones, tablet computers, desktop computers, notebook computers, digital cameras, and the like) have been provided with assorted types of connectors whose primary purpose is to enable an electronic device to exchange data, commands, and/or other signals with one or more other electronic devices. Electrical connectors are basic components needed to make some electrical systems functional. Signal transmission to transfer information (e.g., data, commands, and/or other electrical signals) often utilize electrical connectors between electronic devices, between components of an electronic device, and between electrical systems that may include multiple electronic devices.

It is generally easier and more cost effective to manufacture an electrical system as separate electronic assemblies, such as printed circuit boards ("PCBs"), which may be communicatively joined together with electrical connectors. In some scenarios, the PCBs to be joined may each have connectors mounted on them. The connectors may be mated together directly to interconnect the PCBs.

To facilitate manufacture of different parts of electronic devices in different places by different companies, aspects of the receptacle connectors and the plug connectors may be standardized, either through a formal standard-setting process or through adoption of a particular design by a large number of manufacturers. An example of an interconnection standard is the SAS or Serial Attached SCSI (Small Computer System Interface) standard. Another example is the SFP or Single Form-Factor Pluggable standard, as well as its variations: SFP+, QSFP, QSFP+, etc. Connectors made according to these pluggable standards are sometimes called I/O connectors, because they mate with plugs terminating cables that carry signals into or out of an electronic device. I/O connectors are commonly made with press fit terminal tails that make connections between the terminals in the connector and traces within a PCB when the terminal tails are pressed into holes in the PCB that pass through the traces.

I/O connectors according to these pluggable standards have one or more ports, each configured to receive a plug terminating a cable. It is sometimes desirable for there to be multiple ports in an electronic device, so that the device may communicate through cables with multiple other devices. The ports may be configured in rows and columns, and I/O connectors are sometimes made in a stacked configuration with 2 ports, one above the other. When multiple stacked connectors are mounted on a surface of a PCB, the ports are arrayed in rows and columns. Rows and columns of ports may also be made by mounting I/O connectors on opposite sides of the PCB, one above the other. This configuration is sometimes called "belly to belly."

For electronic devices that require a high-density, high-speed connector, techniques may be used to reduce interference between conductive elements within the connectors, and to provide other desirable electrical properties. One such technique involves the use of shield members between or around adjacent signal conductive elements of a connector system. The shields may prevent signals carried on one conductive element from creating "crosstalk" on another conductive element. The shields may also have an impact on an impedance of the conductive elements, which may further contribute to desirable electrical properties of the connector system.

Another technique that may be used to control performance characteristics of a connector entails transmitting signals differentially. Differential signals result from signals carried on a pair of conducting paths, called a "differential pair." The voltage difference between the conductive paths represents the differential signal. In general, a differential pair is designed with preferential coupling between the conducting paths of the pair. For example, the two conducting paths of a differential pair may be arranged to run closer to each other than to other adjacent signal paths in the connector.

SUMMARY

Aspects of the present application relate to a high speed electrical connector and an applicable printed circuit board thereof.

Some embodiments relate to an electrical connector. The electrical connector comprises a housing comprising a cavity and a first slot and a second slot extending into the cavity in a first direction, a first terminal subassembly comprising a first plurality of terminals held in a first row of terminals, a second terminal subassembly comprising a second plurality of terminals held in a second row of terminals, a third terminal subassembly comprising a third plurality of terminals held in a third row of terminals, and a fourth terminal subassembly comprising a fourth plurality of terminals held in a fourth row of terminals. Each of the first plurality of terminals, the second plurality of terminals, the third plurality of terminals, the fourth plurality of terminals comprises a mating portion, a tail and an intermediate portion joining the mating portion and the tail. The first terminal subassembly, the second terminal subassembly, the third terminal subassembly, and the fourth terminal subassembly are disposed within the cavity with the mating portions extending into a respective slot of the first slot and the second slot. The tails extend at a right angle from respective intermediate portions in four parallel rows in a plane parallel to the first direction.

In some embodiments, the tails in the four parallel rows are spaced, center to center, by 0.7 to 1 mm.

In some embodiments, the tails have a width of 0.25 mm.

In some embodiments, the housing further comprises at least two posts extending through and perpendicular to the plane.

In some embodiments, a plurality of anchor pins attached to the housing. Each anchor pin comprises a pair of opposing spring arms extending through and perpendicular to the plane.

In some embodiments, the tails of the first and fourth terminal subassemblies bend, with respect to intermediate portions of respective terminals, in the first direction. The tails of the second and third terminal subassemblies bend, with respect to intermediate portions of respective terminals, in a second direction opposite the first direction.

In some embodiments, the first terminal subassembly comprises a first row of tails of the four parallel rows. The second terminal subassembly comprises a second row of tails of the four parallel rows. The third terminal subassembly comprises a third row of tails of the four parallel rows. The fourth terminal subassembly comprises a fourth row of tails of the four parallel rows. The first row of tails is adjacent to and offset, in a direction perpendicular to the first direction, from the second row of tails. The third row of tails is adjacent to and offset, in a direction perpendicular to the first direction, from the fourth row of tails.

In some embodiments, the first terminal subassembly comprises a first insulative member holding the first plurality of terminals in the first row of terminals. The second terminal subassembly comprises a second insulative member holding the second plurality of terminals in the second row of terminals. The third terminal subassembly comprises a third insulative member holding the third plurality of terminals in the third row of terminals. The fourth terminal subassembly comprises a fourth insulative member holding the fourth plurality of terminals in the fourth row of terminals. The first insulative member abuts the second insulative member. The third insulative member abuts the fourth insulative member.

In some embodiments, the cavity of the housing is a first cavity. The first insulative member comprises a second cavity. The second insulative member comprises a third cavity. The first terminal subassembly and the second terminal subassembly are positioned with the second cavity aligned with the third cavity. The connector further comprises a ground member disposed in the second cavity and the third cavity, the ground member comprising projecting portions extending towards respective terminals in the first terminal subassembly and the second terminal subassembly.

In some embodiments, the ground member comprises a metal strip. The projecting portions of the ground member comprise spring fingers extending from the metal strip.

In some embodiments, the ground member is a composite lossy member comprising a strip of electrically lossy material. The metal strip is disposed within the strip of lossy material.

In some embodiments, the composite lossy member is a first composite lossy member of a plurality of composite lossy members disposed between the first terminal subassembly and the second terminal subassembly.

In some embodiments, the first insulative member comprises a first projection engaging the housing so as to block movement of the first terminal subassembly in the first direction and a second projection engaging the second insulative member so as to block movement of the second terminal subassembly in the first direction.

In some embodiments, the housing comprises an exterior face between the first slot and the second slot. The exterior face comprises a plurality of openings therethrough.

In some embodiments, the housing between the exterior face and the cavity comprises a lattice defined by walls bounding the plurality of openings.

In a further aspect, an electronic assembly comprises the electrical connector of any of the above mentioned embodiments, a printed circuit board comprising four parallel rows of pads on a surface thereof. The tails in each of the first row of tails, the second row of tails, the third row of tails, the fourth row of tails are soldered to respective pads of the four parallel rows of pads.

Some embodiments relate to an electrical connector. The electrical connector comprises a first plurality of terminals held in a first row, a second plurality of terminals held in a second row parallel to the first row, a third plurality of terminals held in a third row parallel to the first row, a fourth plurality of terminals held in a fourth row parallel to the first row, and a housing comprising a first slot and a second slot, each of the first and second slots extending in a direction parallel to the first row, the second row separated from the first slot in a direction perpendicular to the first row. The first plurality of terminals and the second plurality of terminals are disposed in the first slot. The third plurality of terminals and the fourth plurality of terminals are disposed in the second slot. Each of the first plurality of terminals, the second plurality of terminals, the third plurality of terminals, the fourth plurality of terminals comprises a mating portion, a tail and an intermediate portion joining the mating portion and the tail. Each intermediate portion comprises first and second parts extending in a right angle. The connector comprises a first ground member between the first parts of the intermediate portions of the first and second plurality of terminals, and a second ground member between the second parts of the intermediate portions of the first and second plurality of terminals.

In some embodiments, each of the first and second ground members comprises a strip of electrically lossy material.

In some embodiments, the first plurality of terminals comprise differential pairs of signal terminals separated by ground terminals. The ground terminals of the first plurality of terminals are electrically connected to each other through at least one of the first and second ground members.

In some embodiments, the second plurality of terminals comprise differential pairs of signal terminals separated by ground terminals. The ground terminals of the second plurality of terminals are electrically connected to the ground terminals of the first plurality of terminals through at least one of the first and second ground members.

In some embodiments, a third ground member between the first parts of the intermediate portions of the third and fourth plurality of terminals.

In some embodiments, the third plurality of terminals comprise differential pairs of signal terminals separated by ground terminals. The fourth plurality of terminals comprise differential pairs of signal terminals separated by ground terminals. The ground terminals of the third plurality of terminals are electrically connected to each other and to the ground terminals of the fourth plurality of terminals through the third ground members.

Some embodiments relate to a printed circuit board for receiving an electrical connector, the electrical connector having tails of four parallel rows of terminals extending at a right angle from respective intermediate portions of the four parallel rows of terminals. The printed circuit board comprises a first plurality of solder pads on a first surface of the printed circuit board, the first plurality of solder pads configured to receive a first row of tails of the four parallel rows; a second plurality of solder pads on the first surface, the second plurality of solder pads configured to receive a second row of tails of the four parallel rows; a third plurality of solder pads on the first surface, the third plurality of solder pads configured to receive a third row of tails of the four parallel rows; a fourth plurality of solder pads on the first surface, and the fourth plurality of solder pads configured to receive a fourth row of tails of the four parallel rows. The second plurality of solder pads are adjacent to and offset, in a first direction perpendicular to a second direction that the four parallel rows extend, from the first plurality of solder pads. The fourth plurality of solder pads are adjacent to and offset, in the first direction, from the third plurality of solder pads in the direction. The first plurality of solder pads and the third plurality of solder pads are aligned in the first direction.

In some embodiments, the solder pads of each of the first plurality of solder pad, the second plurality of solder pads, the third plurality of solder pads, and the fourth plurality of solder pads are spaced, center to center, by 0.7 to 1 mm.

In some embodiments, the solder pads have a width greater than respective tails' width.

In some embodiments, the printed circuit board comprises a fifth plurality of solder pads on a second surface of the printed circuit board, the second surface opposite the first surface, the fifth plurality of solder pads aligned to the first row and offset from the first plurality of solder pads; a sixth plurality of solder pads on the second surface, the sixth plurality of solder pads aligned to the second row and offset from the second plurality of solder pads; a seventh plurality of solder pads on the second surface, the seventh plurality of solder pads aligned to the third row and offset from the third plurality of solder pads; and an eighth plurality of solder pads on the second surface, the eighth plurality of solder pads aligned to the fourth row and offset from the fourth plurality of solder pads.

In some embodiments, the printed circuit board comprises first and second through-holes on a first side of the first plurality of solder pad, the second plurality of solder pads, the third plurality of solder pads, and the fourth plurality of solder pads; and third and fourth through-holes on a second side of the first plurality of solder pad, the second plurality of solder pads, the third plurality of solder pads, and the fourth plurality of solder pads, the second side opposite the first side. The first, second, third, and fourth through-holes are configured to receive anchor pins of the connector.

In some embodiments, the first, second, third, and fourth through-holes are not greater in size than the anchor pins of the connector.

In some embodiments, the printed circuit board comprises two locating holes configured to receive respective posts extending from a housing of the connector.

In some embodiments, the two locating holes are greater in size than the posts from the housing of the connector.

The foregoing features may be used, separately or together in any combination, in any of the embodiments discussed herein.

BRIEF DESCRIPTION OF DRAWINGS

Various aspects and embodiments of the present technology disclosed herein are described below with reference to the accompanying figures. It should be appreciated that the figures are not necessarily drawn to scale. Items appearing in multiple figures may be indicated by the same reference numeral. For the purposes of clarity, not every component may be labeled in every figure.

DETAILED DESCRIPTION

Figure 1:
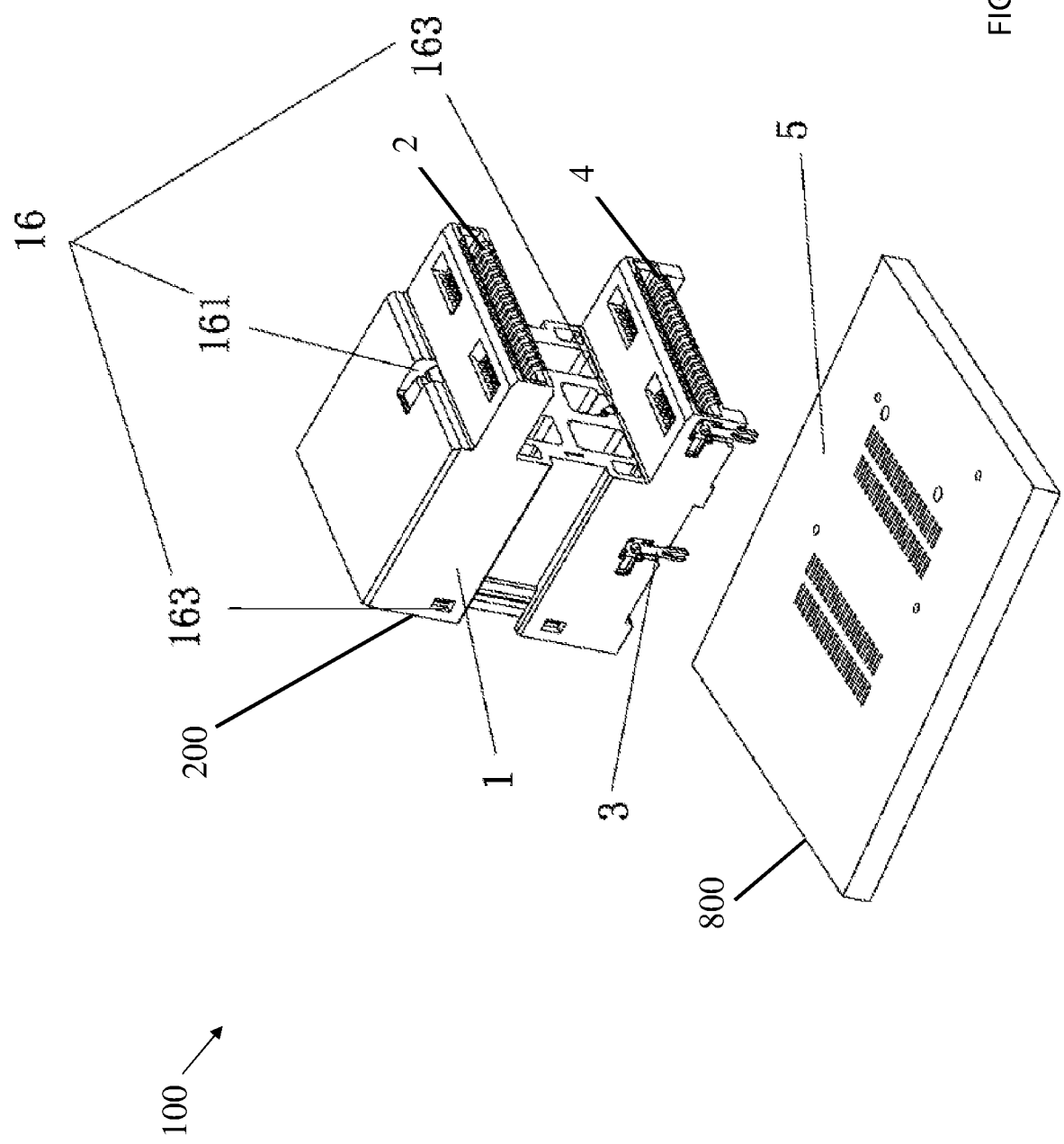
FIG. 1 is a perspective view of an exemplary embodiment of a connector and a printed circuit board configured to receive the connector.

The inventors have recognized and appreciated advantages and techniques for making stacked I/O connectors that are suitable for surface mounting. For example, the inventors have recognized and appreciated that stacked I/O connectors configured for surface mounting may reduce manufacturing defects of devices using those connectors and/or may provide better signal integrity in operation. In contrast to surface mount, connectors with press-fit terminal tails require printed circuit boards (PCBs) including holes configured to receive the press-fit terminal tails. When connectors are mounted to the PCBs, the press-fit pins tend to bend and scratch the plating on the PCBs, which creates manufacturing defects or reduces signal integrity in operation.

Further, the inventors have recognized and appreciated designs for high-speed I/O connectors that facilitate mounting I/O connectors on both the front and back sides of the PCBs, including one above the other in a belly to belly configuration. A large number of holes in the PCB may be required to receive high-speed connectors on both sides, particularly for stacked connector, which increases the difficulty in manufacturing these PCBs and in routing traces within the PCB. The inventors have recognized and appreciated that these difficulties are exacerbated for I/O connectors using press-fit terminal tails, as is conventional, because the holes required for press fit terminals must be sufficiently large to receive the press-fit terminal tails. Making press-fit tails smaller, so that the holes smaller, can increase the risk that the terminal tails will be damaged when the connector is pressed onto the PCB.

The inventors have recognized and appreciated that with surface mountable tails, deformation of the terminal tails and/or scratches on the PCB may be avoided when the connector is mounted to the PCB. Moreover, the holes in the PCB required to make connections between traces in the PCB and surface mount pads can be made smaller than holes that receive press-fit tails, increasing the density of the connector and/or facilitating belly to belly mounting of I/O connectors. Belly to belly mounting may be further facilitated by offsetting rows of terminal tails with respect to each other such that, when I/O connectors with similar footprints are mounted on opposite sides of the PCB, the vias for each connector are offset with respect to each other. The offset configuration may enable the vias making connections to each connector to fit within the same area of the PCB. Such an offset configuration may be simply created as a result of terminal subassemblies, each with a row of terminals.

The PCB may include solder pads on a single surface or both surfaces. The solder pads may be configured for the tails of the connector to be attached to them, such as through a reflow solder operation. As a result, the connector has high density and high speed, requires, requires a smaller mounting area on a PCB, relaxes the limitations in routing PCB traces, and reduces the electrical performance deterioration caused by PCB trace routing limitations.

The inventors have recognized features for an I/O connector, including a stacked I/O connector, to support a robust electronic system when using I/O connectors that are surface mounted to a PCB. The housing of a stacked I/O connector, for example, may be made with openings between ports in combination with terminal subassemblies that enable air flow so as to avoid deformation during a surface mount solder operation. Alternatively or additionally, the I/O connector may have one or more structures that reduce the risk of damage to solder joints when a plug is inserted into the stacked I/O connector or the connectors otherwise stressed during operation.

FIG. 1 shows an electrical assembly 100, including a connector 200 and a printed circuit board 800 configured to receive the connector 200. The connector 200 may include a housing 1, a first signal transmitting portion 2, anchor pins 3, and a second signal transmitting portion 4. The first signal transmitting portion 2, the second signal transmitting portion 4, and the anchor pins 3 may be held together by the housing 1. The housing 1 may be made from a liquid crystal polymer (LCP) and the anchor pins 3 may be made by stamping a copper alloy.

Figure 2:
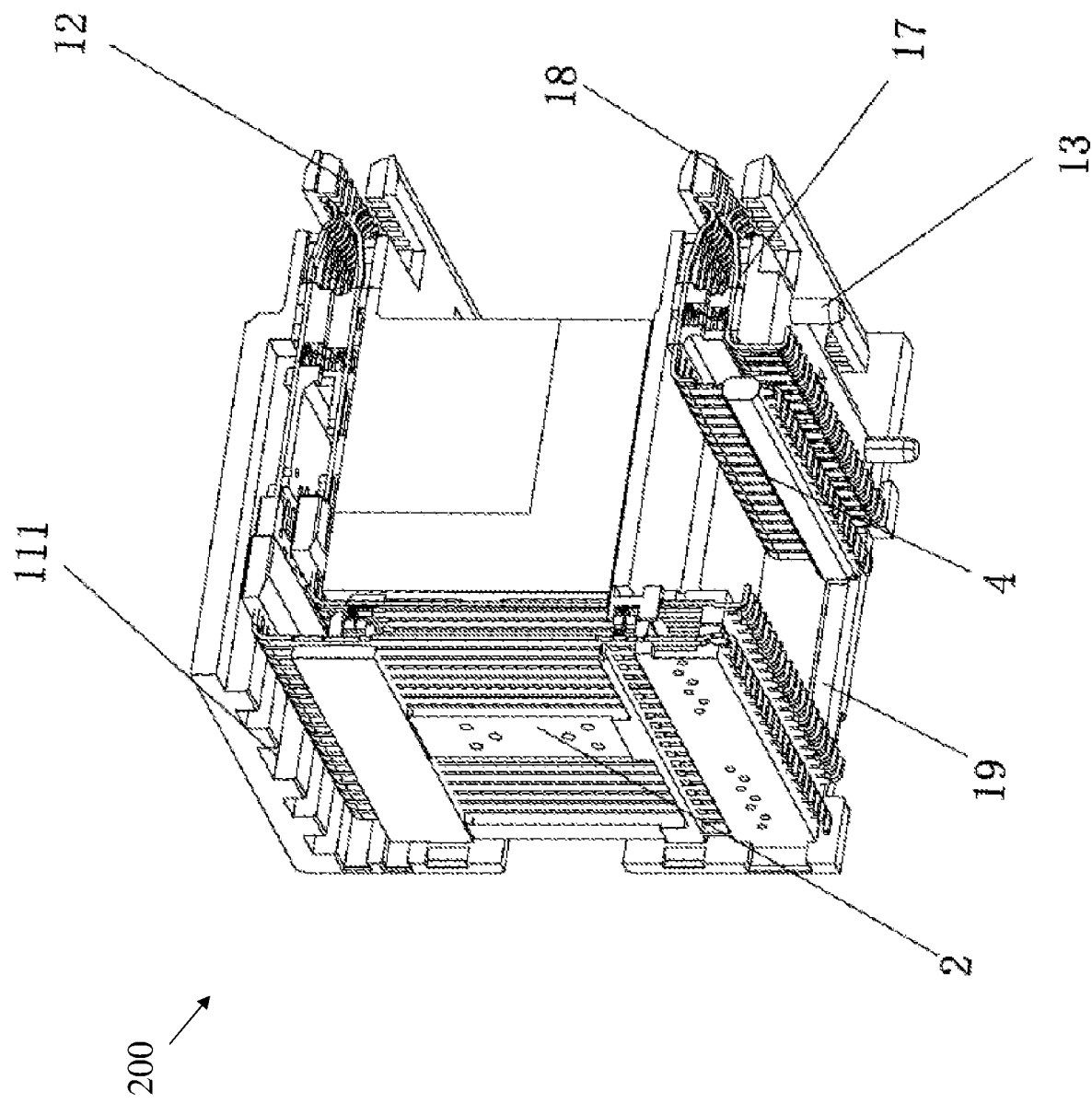
FIG. 2 is a perspective view of the connector of FIG. 1, with a side wall of the housing cut away, illustrating parts of the connector.
Figure 3:
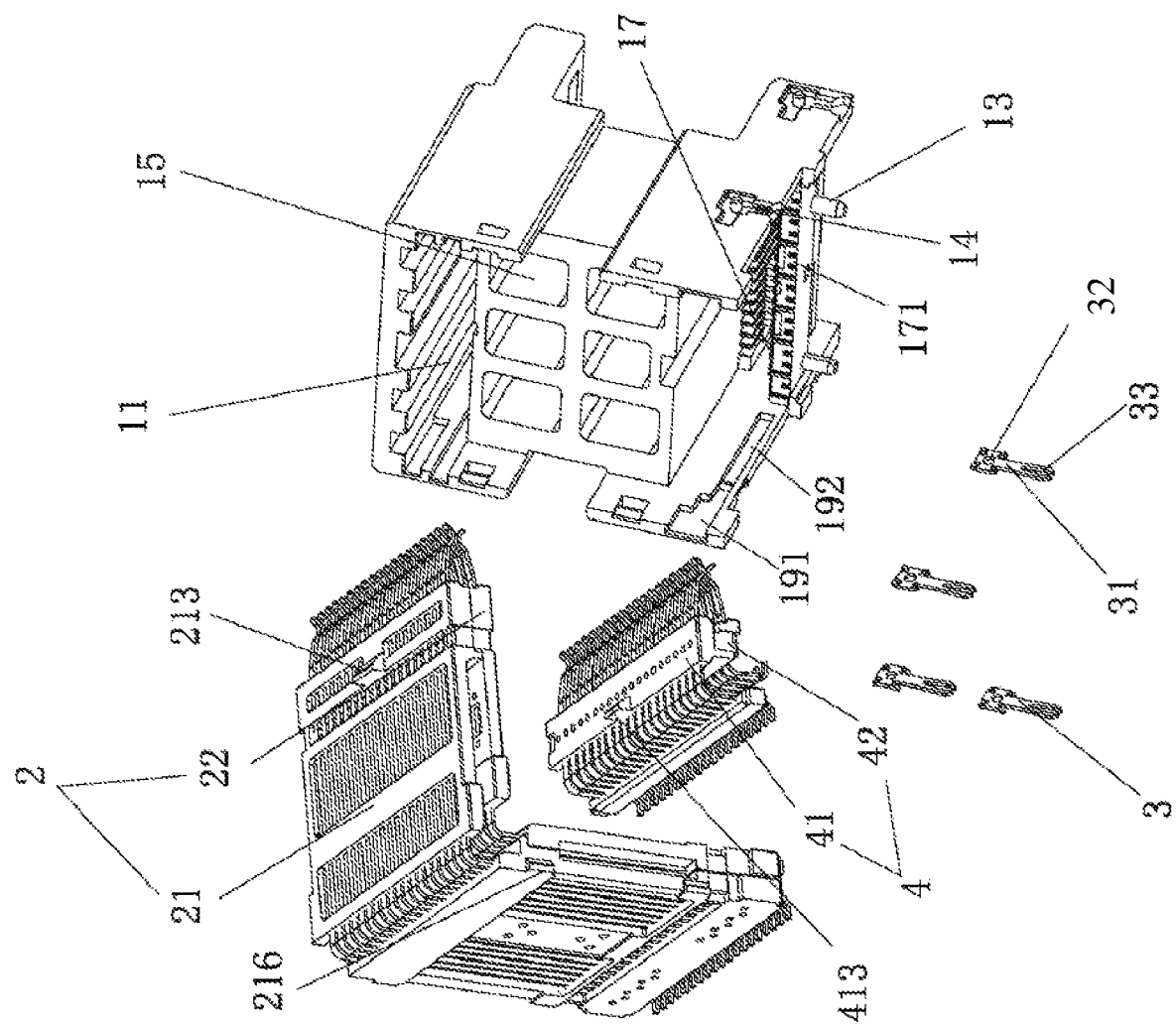
FIG. 3 is an exploded view of the connector of FIG. 1.

FIG. 2 shows a perspective view of the connector 200, with a side wall of the housing 1 cut away. FIG. 3 is an exploded view of the connector of FIG. 1. The first and second signal transmitting portions 2 and 4 may be arranged as row-oriented arrays, including a plurality of row terminal subassemblies disposed one above the other in a direction perpendicular to a surface of the PCB 800.

Each row terminal subassembly may include a mating interface configured to receive, for example, a card, a mounting interface configured to, for example, mount to a PCB, and a body extending between the mating interface and the mount interface. The body may include a first part connected to the mating interface, and a second part connected to the mounting interface. The first and second parts may extend in a right angle such that a card inserted in one of the signal transmitting portions 2 and 4 extends parallel to a PCB that the connector is mounted to.

In the illustrated example, the first signal transmitting portion 2 includes a first upper row terminal subassembly 21 and a first lower row terminal subassembly 22. The second signal transmitting portion 4 includes a second upper row terminal subassembly 41 and a second lower row terminal subassembly 42. The first upper row terminal subassembly 21 and the first lower row terminal subassembly 22 may be held together in an upper installation slot 11 by the housing 1. The second upper row terminal subassembly 41 and the second lower row terminal subassembly 42 may be held together in a lower installation slot 17 by the housing 1.

Additionally or alternatively, the first upper row terminal subassembly 21 and the first lower row terminal subassembly 22 may be held together before being assembled into the housing 1. The second upper row terminal subassembly 41 and the second lower row terminal subassembly 42 may be held together before being assembled into the housing 1. The first and second upper and lower row terminal subassemblies may include attachment features, or otherwise be attached to one another in some embodiments.

The housing 1 may include the upper installation slot 11 and the lower installation slot 17, insertion slots 12 and 18, recesses 14, 16 and 19, posts 13, and openings 15. The installation slots 11 and 17 may be inside the housing 1. The upper installation slot 11 may extend a shorter length then the lower installation slot 17 such that the mounting interfaces of the first signal transmitting portion 2 and the mounting interfaces of the second signal transmitting portion 4 are offset in a direction perpendicular to a row direction that a row terminal extends. The installation slots 11 and 17 may be bounded by insulative material, such as housing 1, with grooves 111 and 171. The grooves may be positioned to remove insulative material along signal terminals so as to change the effective dielectric constant of material surrounding the signal conductors, which can adjust impedance of those signal terminals.

The insertion slots 12 and 18 may be arranged on the front side of the housing 1. The mating interface of the first signal transmitting portion 2 including, for example, mating portions 2113, 2213 (FIG. 6), may be held in the insertion slot 12. The mating interface of the second signal transmitting portion 4 including, for example, mating portions 4113, 4213 (FIG. 6), may be held in the insertion slot 18. The mating portions may be positioned in this way to make contact with pads on a paddle card of a plug inserted into the insertion slots 12 and 18.

Features, for example, recesses 14 in housing 1, may retain anchor pins 3. The anchor pins 3 each may include a body 31, a mounting hole 32, and spring arms 33. The mounting hole 32 may be located above the terminal body 31. The two spring arms 33 may extend from the terminal body 31 and towards opposite directions. The outside size of the swinging arms 33 may be 1.1 mm. After being soldered to a PCB, the anchor pins 3 may fix the connector to the PCB. Anchor pins 3 may also prevent the connector from floating during surface mounted technology (SMT) soldering of the first signal transmitting portion 2 and the second signal transmitting portion 4 of the connector to the PCB, thus avoiding dry joints.

The recesses 16 and 19 in surfaces of the housing 1 are configured to receive matching structures from the first signal transmitting portion 2 and the second signal transmitting portion 4, holding the signal transmitting portions in hosing 1. In the illustrated example, four anchor pins 3 each is held in a respective recess 14. The four recesses 14 are asymmetrically distributed on the two sides of the housing 1. The recesses 16 includes top recesses 161 and side recesses 162 and 163. The recesses 19 may include recesses 191 and 192.

The openings 15 may be arranged between the installation slots 11 and 17. The openings 15 may extend through surfaces of the housing 1 and substantially parallel to installation slots 11 and 17. The openings 15 may reduce the weight of the housing 1, and may also facilitate ventilation and heat dissipation during a surface mount solder operation. In the illustrated example, the housing 1 includes a lattice defined by walls bounding a plurality of openings 15.

In the illustrated embodiment, airflow through the openings may be enabled by the row-oriented terminal subassemblies in which each subassembly, such as first upper row terminal subassembly 21 and a first lower row terminal subassembly 22, has a row of terminals with space between the terminals. The insulative members holding the row of terminals together covers only a portion of the length of the intermediate portions of the terminals. As a result, air flow through openings 15 and around the terminals—allowing flow from front to back of the receptacle connector.

The posts 13 may extend from the bottom of the housing 1. The housing 1 may include at least two posts 13 such that the connector 200 may be first aligned to a footprint on a PCB (e.g., PCB 800) though the posts 13. After inserting the posts 13 into matching holes in the PCB, the solders pins may be aligned to respective solder pads on the PCB before being soldered to the pads. The posts 13 may have a the diameter of 1.0 mm.

Figure 4:
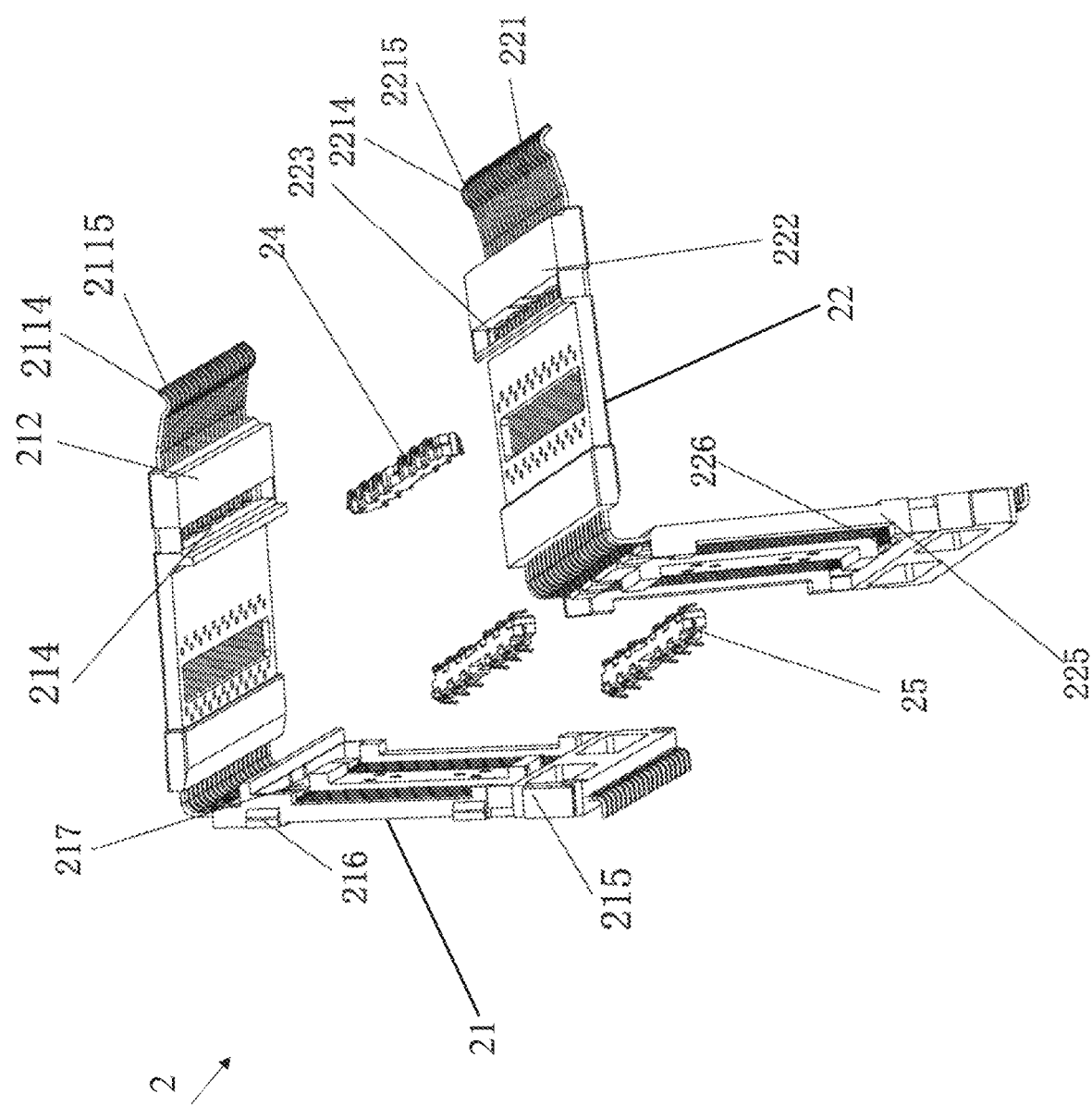
FIG. 4 is an exploded view of the first signal transmitting portion of FIG. 1.
Figure 5:
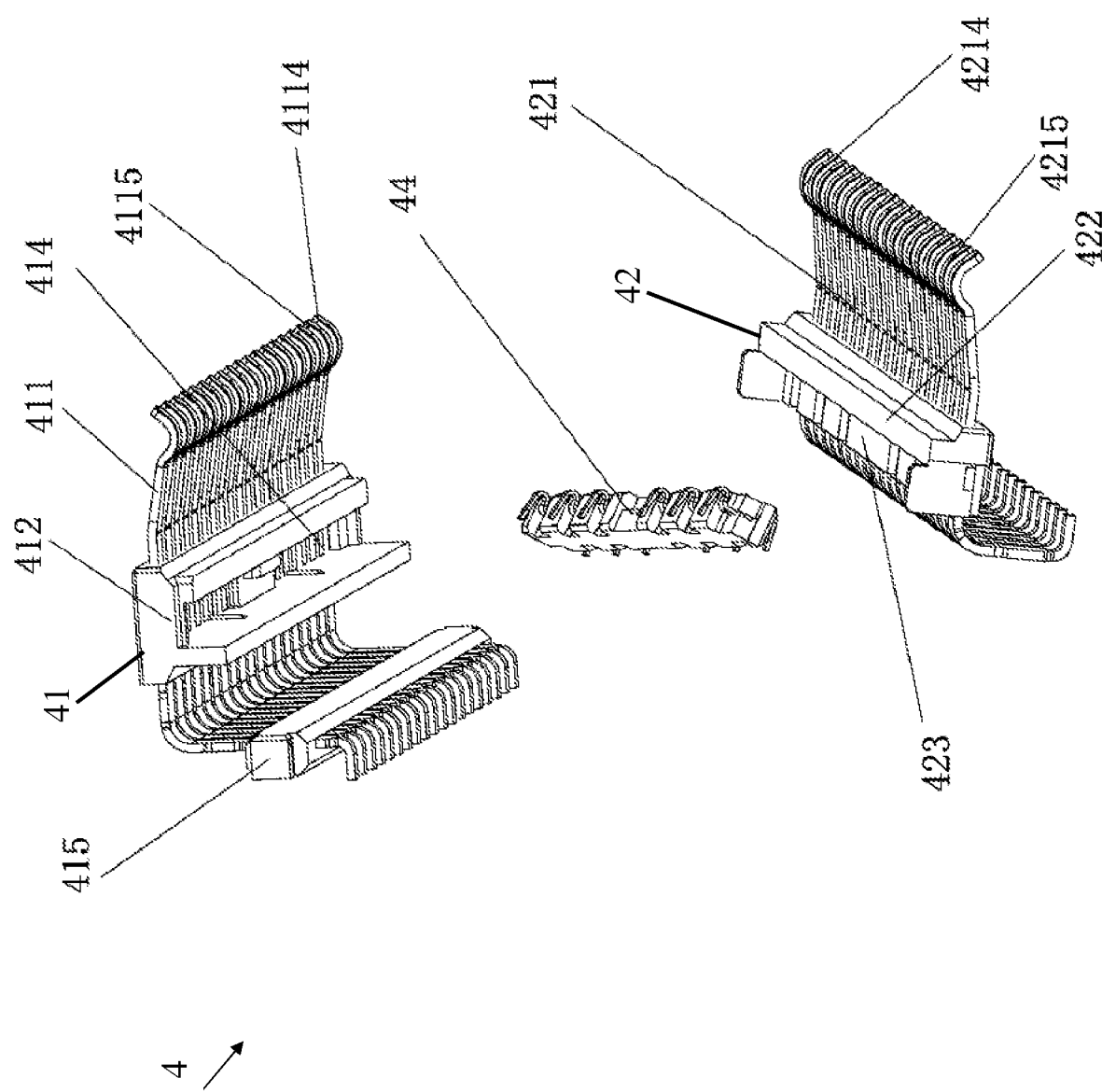
FIG. 5 is an exploded view of the second signal transmitting portion of FIG. 1.
Figure 6:
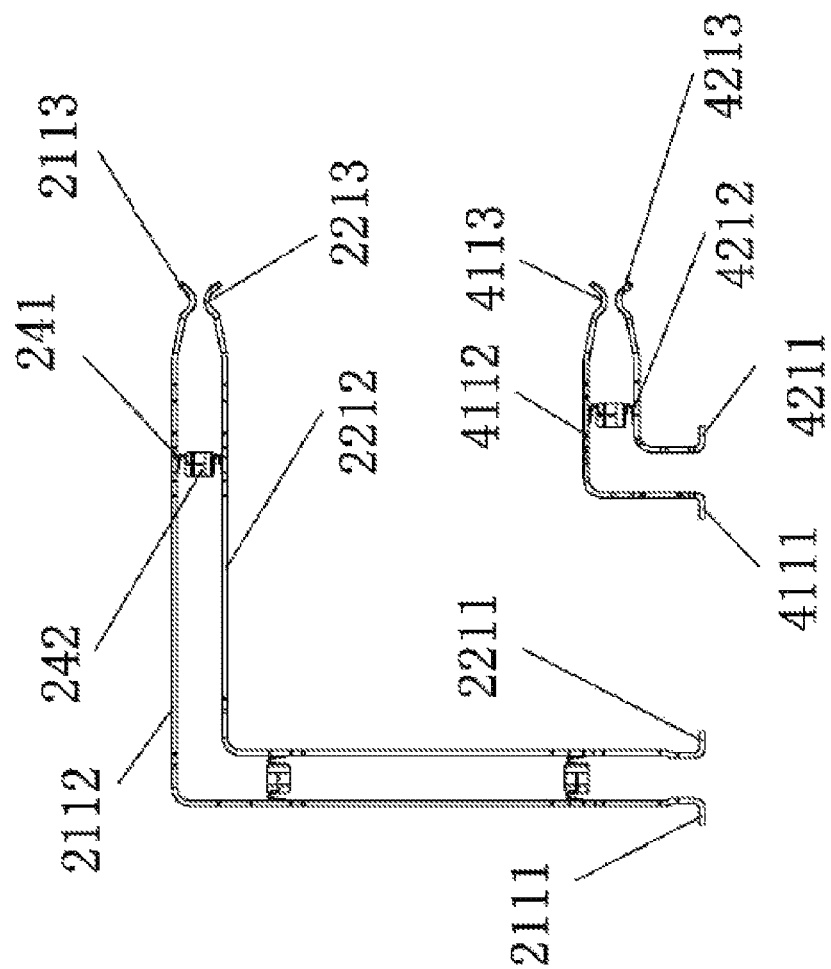
FIG. 6 is a side view of partial structures of the first signal transmitting portion of FIG. 4 and the second signal transmitting portion of FIG. 5, with insulative members cut away.
Figure 7:
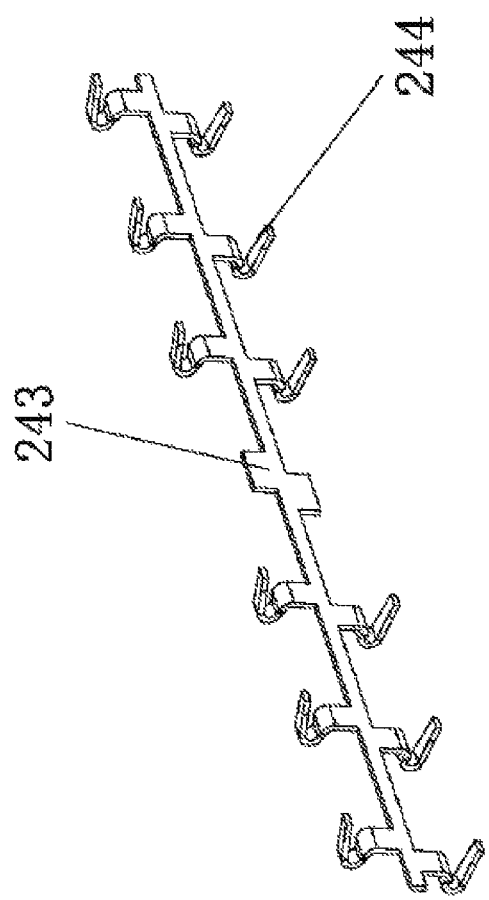
FIG. 7 is a perspective view of a metal strip of a ground member of the connector of FIG. 1.

FIG. 4 is an exploded view of the first signal transmitting portion 2. FIG. 5 is an exploded view of the second signal transmitting portion 4. FIG. 6 is a side view of partial structures of the first signal transmitting portion 2 and the second signal transmitting portion 4, with insulative members cut away. FIG. 7 is a perspective view of a metal strip of a ground member of the connector 200.

The first signal transmitting portion 2 may include the first upper row terminal subassembly 21, the first lower row terminal subassembly 22, and plurality of ground members, of which ground members 24 and 25 are numbered. The ground members 24 and 25 may be assembled between the first terminal subassembly 21 and the second terminal subassembly 22, with spring arms 244 close to or pressing against ground terminals in the terminal subassemblies.

The first terminal subassembly 21 may include a plurality of upper row terminals 211, insulative member 212, and insulative member 215. The insulative member 212 and insulative member 215 may be plastics molded over the plurality of upper row terminals 211. The insulative members 212 and 215 may include projections configured to be inserted into the recesses 16, and 19 of the housing 1 such that the first terminal subassembly 21 is fixedly held in the housing 1. In the illustrated example, the insulative member 212 includes projection 213 (FIG. 3) configured to be inserted into recess 161, two projections 216 arranged on two sides of the insulative member 215 configured to be inserted into recesses 163.

The second terminal subassembly 22 may include a plurality of lower row terminals 221, insulative member 222, and insulative member 225. The insulative member 222 and insulative member 225 may be plastic molded over the plurality of lower row terminals 222. The insulative member 212 and insulative member 222 may be assembled together. The insulative member 215 and insulative member 225 may be assembled together. The insulative member 215 and insulative member 225 may be confined in recess 191 of housing 1.

The plurality of upper row terminals 211 each may include solder pin 2111, intermediate portion 2112, and mating portion 2113 that extends between the solder pin 2111 and the mating portion 2113. The solder pins 2111 extend in a right angle from the intermediate portions 2112, and may serve as solder mount terminal tails. The plurality of upper row terminals 211 may include differential pairs of signals terminals separated by ground terminals.

In the illustrated example, the plurality of upper row terminals 211 include nineteen terminals disposed horizontally. The plurality of upper row terminals 211 include ground terminals 2114 and signal terminals 2115. The ground terminals 2114 and signal terminals 2115 are arranged at intervals. The first, fourth, seventh, thirteenth, sixteenth and nineteenth (counted from left to right) of the upper row terminals 211 are ground terminals 2114 and the others are signal terminals 2115. The center-to-center distance between the adjacent upper row terminals 211 may be 0.8 mm.

The plurality of lower row terminals 221 may include solder pin 2211, intermediate portion 2212, and mating portion 2213 that extends between the solder pin 2211 and the mating portion 2213. The solder pins 2211 extend in a right angle from the intermediate portions 2212, and opposite to a direction that solder pins 2111 extend. The solder pins 2211 may also serve as solder mount terminal tails. The plurality of lower row terminals 221 may include differential pairs of signals terminals separated by ground terminals.

In the illustrated example, the plurality of lower row terminals 221 include nineteen terminals disposed horizontally. The lower row terminals 221 include ground terminals 2214 and signal terminals 2215. The ground terminals 2214 and signal terminals 2215 are arranged at intervals. The first, fourth, seventh, thirteenth, sixteenth and nineteenth (counted from left to right) of the lower row terminals 221 are ground terminals 2214 and the others are signal terminals 2215. The central distance between the adjacent lower row terminals 221 may be 0.8 mm.

The upper row terminals 211 and lower row terminals 221 may be made by stamping a copper alloy. The width of the first solder pin 2111 and second solder pin 2211 may be 0.25 mm. The ground member 24 may electrically connect a plurality of ground terminals 2114 and ground terminals 2214, which may reduce the insertion loss and crosstalk interference during signal transmission.

The insulative member 212 of the first terminal subassembly 21 may include a mounting area 214. The insulative member 222 of the second terminal subassembly 22 may include a mounting area 223. The ground member 24 may be fit in the mounting areas 214 and 223, and between the first terminal subassembly 21 and the second terminal subassembly 22.

The first terminal subassembly 21 and second terminal subassembly 22 may include additional ground members in between, for example, ground members 25. The insulative member 215 of the first terminal subassembly may include additional mounting areas, for example, mounting areas 217. The insulative member 225 of the second terminal subassembly 22 may include additional mounting areas, for example, mounting area 226. The ground member 25 may be fit in the mounting areas 217 and 226. The ground member 25 may provide electrical connections between the plurality of ground terminals 2114 and ground terminals 2214, which may further reduce the insertion loss and crosstalk interference during signal transmission.

The ground members 24 and 25 may be made with metal and/or lossy portions. The ground members may have projections extending towards, and in some embodiments, contacting, the ground terminals.

In the illustrated example, the ground members 24 and 25 each includes a metal stripe 241 and a stripe of lossy material 242 molded over the metal stripe 241. The metal stripe 241 includes a body 243 and six spring arms 244 extending from the body 243. The spring arms 244 contact ground terminals 2114 and ground terminal 2214.

Any suitable lossy material may be used for these and other structures that are "lossy." Materials that conduct, but with some loss, or material which by another physical mechanism absorbs electromagnetic energy over the frequency range of interest are referred to herein generally as "lossy" materials. Electrically lossy materials can be formed from lossy dielectric and/or poorly conductive and/or lossy magnetic materials. Magnetically lossy material can be formed, for example, from materials traditionally regarded as ferromagnetic materials, such as those that have a magnetic loss tangent greater than approximately 0.05 in the frequency range of interest. The "magnetic loss tangent" is the ratio of the imaginary part to the real part of the complex electrical permeability of the material. Practical lossy magnetic materials or mixtures containing lossy magnetic materials may also exhibit useful amounts of dielectric loss or conductive loss effects over portions of the frequency range of interest. Electrically lossy material can be formed from material traditionally regarded as dielectric materials, such as those that have an electric loss tangent greater than approximately 0.05 in the frequency range of interest. The "electric loss tangent" is the ratio of the imaginary part to the real part of the complex electrical permittivity of the material. Electrically lossy materials can also be formed from materials that are generally thought of as conductors, but are either relatively poor conductors over the frequency range of interest, contain conductive particles or regions that are sufficiently dispersed that they do not provide high conductivity or otherwise are prepared with properties that lead to a relatively weak bulk conductivity compared to a good conductor such as copper over the frequency range of interest.

Electrically lossy materials typically have a bulk conductivity of about 1 Siemen/meter to about 10,000 Siemens/meter and preferably about 1 Siemen/meter to about 5,000 Siemens/meter. In some embodiments material with a bulk conductivity of between about 10 Siemens/meter and about 200 Siemens/meter may be used. As a specific example, material with a conductivity of about 50 Siemens/meter may be used. However, it should be appreciated that the conductivity of the material may be selected empirically or through electrical simulation using known simulation tools to determine a suitable conductivity that provides a suitably low crosstalk with a suitably low signal path attenuation or insertion loss.

Electrically lossy materials may be partially conductive materials, such as those that have a surface resistivity between 1 Ω/square and 100,000 Ω/square. In some embodiments, the electrically lossy material has a surface resistivity between 10 Ω/square and 1000 Ω/square. As a specific example, the material may have a surface resistivity of between about 20 Ω/square and 80 Ω/square.

In some embodiments, electrically lossy material is formed by adding to a binder a filler that contains conductive particles. In such an embodiment, a lossy member may be formed by molding or otherwise shaping the binder with filler into a desired form. Examples of conductive particles that may be used as a filler to form an electrically lossy material include carbon or graphite formed as fibers, flakes, nanoparticles, or other types of particles. Metal in the form of powder, flakes, fibers or other particles may also be used to provide suitable electrically lossy properties. Alternatively, combinations of fillers may be used. For example, metal plated carbon particles may be used. Silver and nickel are suitable metal plating for fibers. Coated particles may be used alone or in combination with other fillers, such as carbon flake. The binder or matrix may be any material that will set, cure, or can otherwise be used to position the filler material. In some embodiments, the binder may be a thermoplastic material traditionally used in the manufacture of electrical connectors to facilitate the molding of the electrically lossy material into the desired shapes and locations as part of the manufacture of the electrical connector. Examples of such materials include liquid crystal polymer (LCP) and nylon. However, many alternative forms of binder materials may be used. Curable materials, such as epoxies, may serve as a binder. Alternatively, materials such as thermosetting resins or adhesives may be used.

Also, while the above described binder materials may be used to create an electrically lossy material by forming a binder around conducting particle fillers, the invention is not so limited. For example, conducting particles may be impregnated into a formed matrix material or may be coated onto a formed matrix material, such as by applying a conductive coating to a plastic component or a metal component. As used herein, the term "binder" encompasses a material that encapsulates the filler, is impregnated with the filler or otherwise serves as a substrate to hold the filler.

Preferably, the fillers will be present in a sufficient volume percentage to allow conducting paths to be created from particle to particle. For example, when metal fiber is used, the fiber may be present in about 3% to 40% by volume. The amount of filler may impact the conducting properties of the material.

Filled materials may be purchased commercially, such as materials sold under the trade name Celestran® by Celanese Corporation which can be filled with carbon fibers or stainless steel filaments. A lossy material, such as lossy conductive carbon filled adhesive preform, such as those sold by Techfilm of Billerica, Mass., US may also be used. This preform can include an epoxy binder filled with carbon fibers and/or other carbon particles. The binder surrounds carbon particles, which act as a reinforcement for the preform. In some embodiments, the preform may adhere to a metal member through the adhesive in the preform, which may be cured in a heat treating process. In some embodiments, the adhesive may take the form of a separate conductive or non-conductive adhesive layer.

Various forms of reinforcing fiber, in woven or non-woven form, coated or non-coated may be used. Non-woven carbon fiber is one suitable material. Other suitable materials, such as custom blends as sold by RTP Company, can be employed, as the present invention is not limited in this respect.

The second signal transmitting portion 4 may include a second upper row terminal subassembly 41, a second lower row terminal subassembly 42, and a ground member 44.

a second ground member 44, the second ground member 44 is assembly-connected with the second upper row terminal subassembly 41 and the second lower row terminal subassembly 42, and the second upper row terminal subassembly 41 is assembly-connected with the second lower row terminal subassembly 42.

The second upper row terminal subassembly 41 may include a plurality of upper row terminals 411, insulative member 412 and insulative member 415, which may be molded over the upper row terminals 411. The insulative member 412 may include projection 413. The insulative member 412 may include mounting area 414. The insulative member 415 may be confined in locating slot 192 of the housing 1.

The second lower row terminal subassembly 42 may include a plurality of lower row terminals 421 and insulative member 422, which may be molded over the lower row terminals 421. The insulative member 412 and insulative member 422 may be assembled together through the installation slot 17 of the housing 1. The insulative member 422 may include mounting area 423. The ground member 44 may fit in the mounting area 414 and mounting area 423 between the second upper row terminal subassembly 41 and the second lower row terminal subassembly 42. The ground member 44 may be structurally the same as the ground member 24.

In the illustrated example, each upper row terminal 411 comprises solder pin 4111, intermediate portion 4112 and mating portion 4113 connected in series. In the illustrated embodiment, there are nineteen upper row terminal 411 in a row. The upper row terminals 411 may be ground terminals 4114 or signal terminals 4115. The terminal 4114 and terminal 4115 are arranged at intervals, such as in a repeating pattern of a pair of signal terminals followed by a ground terminal. Each lower row terminal 421 comprises solder pin

4211, connecting body 4212 and mating portion 4213 in series. There are nineteen lower row terminal 421 in a row. The lower row terminals 421 may be ground terminals 4214 and signal terminals 4215. The ground terminals 4214 and signal terminals 4215 are arranged at intervals, and may have the same pattern of ground and signal terminals as the upper row. Solder pin 4111 and solder pin 4211 point in opposite directions. The ground member 44 electrically connects ground terminal 4114 and ground terminal 4214.

The center-to-center spacing between the adjacent upper row terminals 411 may be 0.8 mm. The first, fourth, seventh, thirteenth, sixteenth and nineteenth (counted from left to right) of the upper row terminals 411 may be terminals 4114 and the others may be terminals 4115. The center-to-center spacing between the adjacent lower row terminals 421 may be 0.8 mm. The first, fourth, seventh, thirteenth, sixteenth and nineteenth (counted from left to right) of the lower row terminals 421 may be terminals 4214 and the others may be terminals 4215. The upper row terminals 411 and lower row terminals 421 may be made by stamping a copper alloy. The width of the solder pin 4111 and solder pin 4211 may be 0.25 mm. The ground member 44 may electrically connect terminals 4114 and terminals 4214 to reduce the insertion loss and crosstalk during signal transmission.

Figure 8:
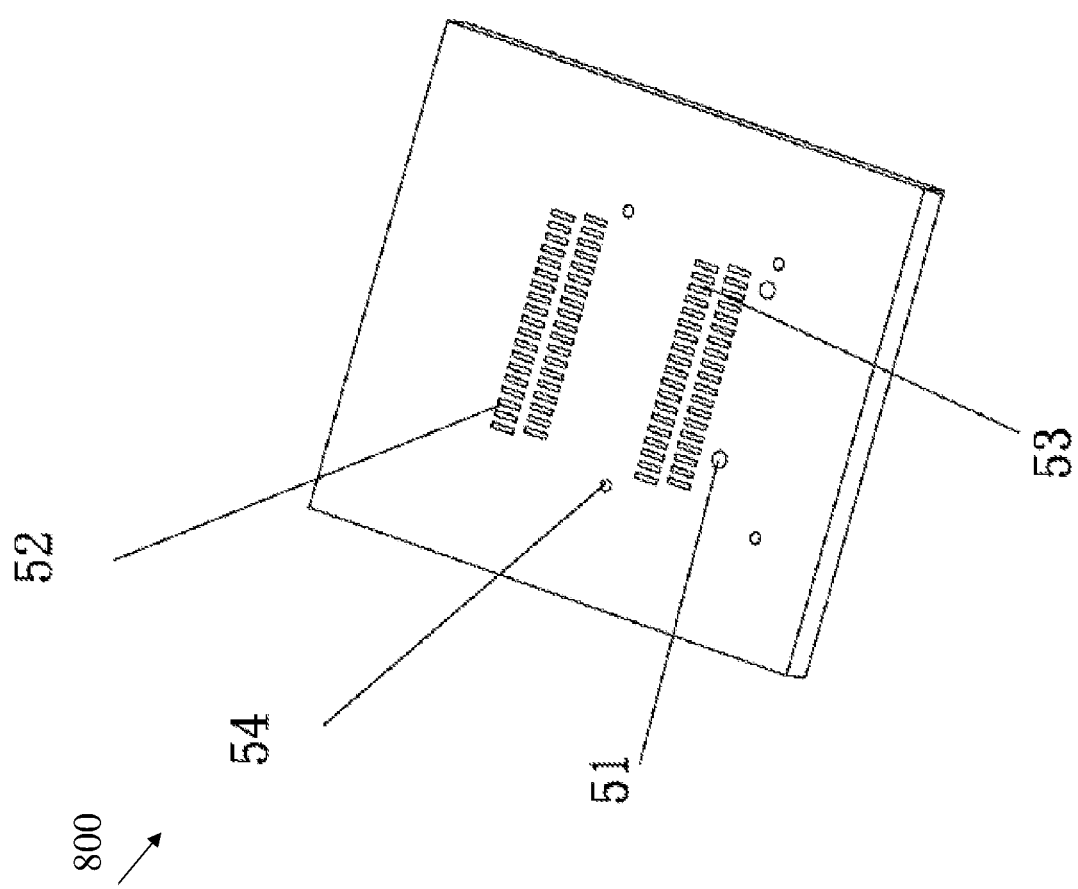
FIG. 8 is a perspective view of the printed circuit board of FIG. 1.

FIG. 8 is a perspective view of the printed circuit board 800. The PCB 800 may be configured to receive the connector 200. The PCB 800 may include a board body 5, which may include locating holes 51 configured to receive posts 13, solder pads 52 configured to receive solder pins 2111 and solder pins 2211, solder pad 53 configured to receive solder pins 4111 and solder pins 4211, and holes 54, which may be through holes, configured to receive anchor pins 3.

In the illustrated example, the diameter of the locating holes 51 is 1.1 mm and two locating holes are provided. The diameter of the through holes 54 is 1.05 mm and four holes 54 are provided. Two rows of solder pads 52 and two rows of solder pads 53 are respectively provided, with nineteen solder pads in each row. The width of the solder pads 52 is 0.35 mm and the width of the solder pads 53 is 0.35 mm, which may be greater than a respective solder pin's width such that low-resistance solder joints may be formed. The center-to-center spacing in a horizontal direction between adjacent the solder pads 52 or solder pads 53 is 0.8 mm. The solder pads 52 and solder pads 53 are distributed on the front side of the PCB. Although the solder pads 52 and 53 are illustrated on the front side, the PCB may include additional solder pads on its back side for a connector with a belly to belly configuration.

Solder pins are adopted for the terminals of the first signal transmitting portion 2 and the second signal transmitting portion 4 to be soldered to a PCB. The solder pins 2111 and solder pins 2211 may be surface-mounted on solder pads 52 of the PCB 800. Solder pins 4111 and solder pins 4211 are surface-mounted on solder pads 53 of the PCB 800. In contrast to conventional mounting of a connector with press-fits, the connector has high density and high speed, and requires a smaller mounting area on a PCB, relaxes the limitations in routing PCB traces, and reduces the electrical performance deterioration caused by PCB trace routing limitations. The terminals 2214 and terminals 2215 are distributed at intervals, improving signal integrity and alleviating signal crosstalk during signal transmission.

In the embodiment illustrated in FIG. 8 pads 53 are in two parallel rows, corresponding to a row to receive solder pins 4111 and another row to receive solder pins 4211. Those rows are offset from each other in the row direction. The row of solder pins 4111 is offset from the row of solder pins 4211 by the same amount. Such an offset in the solder pins 4111 with respect to solder pins 4211 may result from the entirety of each of the terminals 411 being substantially in the same plane and each of the terminals 421 being substantially in the same plane, but the row of terminals 411 being offset from the row of terminals 421. In such a configuration, the mating portions, as well as the intermediate portions of terminals 411 will also be offset from the terminals 421. Alternatively, the terminals 411 and/or 421 may not be substantially within a plane. The solder pins 4111 and/or solder pins 4211 may bend out of the plane containing the mating portions of their respective terminals, for example. As a result, the mating portions of terminals 411 and 421 may be aligned, in a direction perpendicular to the surface of PCB 800, though other portions of opposing terminals may be offset in the row direction.

Similar offsets for some or all of the terminals in rows 211 and 221, which are mounted to pads 52, which are also arrayed in two rows on PCB 800. As with pads 53, the two rows of pads 52 are offset with respect to each other.

It should be understood that various alterations, modifications, and improvements may be made to the structures, configurations, and methods discussed above, and are intended to be within the spirit and scope of the invention disclosed herein.

Further, although advantages of the present invention are indicated, it should be appreciated that not every embodiment of the invention will include every described advantage. Some embodiments may not implement any features described as advantageous herein. Accordingly, the foregoing description and attached drawings are by way of example only.

It should be understood that some aspects of the present technology may be embodied as one or more methods, and acts performed as part of a method of the present technology may be ordered in any suitable way. Accordingly, embodiments may be constructed in which acts are performed in an order different than shown and/or described, which may include performing some acts simultaneously, even though shown and/or described as sequential acts in various embodiments.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Further, terms denoting direction have been used, such as "left", "right", "forward" or "up". These terms are relative to the illustrated embodiments, as depicted in the drawings, for ease of understanding. It should be understood that the components as described herein may be used in any suitable orientation.

Use of ordinal terms such as "first," "second," "third," etc., in the description and the claims to modify an element does not by itself connote any priority, precedence, or order of one element over another, or the temporal order in which acts of a method are performed, but are used merely as labels to distinguish one element or act having a certain name from another element or act having a same name (but for use of the ordinal term) to distinguish the elements or acts.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

As used herein in the specification and in the claims, the phrase "equal" or "the same" in reference to two values (e.g., distances, widths, etc.) means that two values are the same within manufacturing tolerances. Thus, two values being equal, or the same, may mean that the two values are different from one another by ±5%.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

Also, the phraseology and terminology used herein is for the purpose of description and should not be regarded as limiting. Use of terms such as "including," "comprising," "comprised of," "having," "containing," and "involving," and variations thereof herein, is meant to encompass the items listed thereafter and equivalents thereof as well as additional items.

The terms "approximately" and "about" if used herein may be construed to mean within ±20% of a target value in some embodiments, within ±10% of a target value in some embodiments, within ±5% of a target value in some embodiments, and within ±2% of a target value in some embodiments. The terms "approximately" and "about" may equal the target value.

The term "substantially" if used herein may be construed to mean within 95% of a target value in some embodiments, within 98% of a target value in some embodiments, within 99% of a target value in some embodiments, and within 99.5% of a target value in some embodiments. In some embodiments, the term "substantially" may equal 100% of the target value.

What is claimed is:

1. An electrical connector comprising:
    a housing comprising a first cavity and a first slot and a second slot extending into the first cavity in a first direction;
    a first terminal subassembly comprising a first plurality of terminals held in a first row of terminals by a first insulative member comprising a second cavity;
    a second terminal subassembly comprising a second plurality of terminals held in a second row of terminals by a second insulative member comprising a third cavity;
    a third terminal subassembly comprising a third plurality of terminals held in a third row of terminals;
    a fourth terminal subassembly comprising a fourth plurality of terminals held in a fourth row of terminals; and
    a ground member disposed in the second cavity and the third cavity, the ground member comprising a metal strip,
    wherein:
        each of the first plurality of terminals, the second plurality of terminals, the third plurality of terminals, the fourth plurality of terminals comprises a mating portion, a tail and an intermediate portion joining the mating portion and the tail,
        the first terminal subassembly, the second terminal subassembly, the third terminal subassembly, and the fourth terminal subassembly are disposed within the first cavity with the mating portions extending into a respective slot of the first slot and the second slot, and
        the tails extend at a right angle from respective intermediate portions in four parallel rows in a plane parallel to the first direction.

2. The electrical connector of claim 1, wherein:
    the tails in the four parallel rows are spaced, center to center, by 0.7 to 1 mm.

3. The electrical connector of claim 1, wherein:
    the tails have a width of 0.25 mm.

4. The electrical connector of claim 1, wherein:
    the housing further comprises at least two posts extending through and perpendicular to the plane.

5. The electrical connector of claim 1, further comprising:
    a plurality of anchor pins attached to the housing, wherein each anchor pin comprises a pair of opposing spring arms extending through and perpendicular to the plane.

6. The electrical connector of claim 1, wherein:
    the tails of the first and fourth terminal subassemblies bend, with respect to intermediate portions of respective terminals, in the first direction; and
    the tails of the second and third terminal subassemblies bend, with respect to intermediate portions of respective terminals, in a second direction opposite the first direction.

7. The electrical connector of claim 6, wherein:
    the first terminal subassembly comprises a first row of tails of the four parallel rows, the second terminal subassembly comprises a second row of tails of the four parallel rows, the third terminal subassembly comprises a third row of tails of the four parallel rows, and the fourth terminal subassembly comprises a fourth row of tails of the four parallel rows;

the first row of tails is adjacent to and offset, in a direction perpendicular to the first direction, from the second row of tails; and the third row of tails is adjacent to and offset, in a direction perpendicular to the first direction, from the fourth row of tails.

8. An electronic assembly, comprising:
the electrical connector of claim 7;
a printed circuit board comprising four parallel rows of pads on a surface thereof; and
the tails in each of the first row of tails, the second row of tails, the third row of tails, the fourth row of tails are soldered to respective pads of the four parallel rows of pads.

9. The electrical connector of claim 7, wherein:
the third terminal subassembly comprises a third insulative member holding the third plurality of terminals in the third row of terminals;
the fourth terminal subassembly comprises a fourth insulative member holding the fourth plurality of terminals in the fourth row of terminals;
the first insulative member abuts the second insulative member; and
the third insulative member abuts the fourth insulative member.

10. The electrical connector of claim 9, wherein:
the first terminal subassembly and the second terminal subassembly are positioned with the second cavity aligned with the third cavity; and
the ground member comprising projecting portions extending towards respective terminals in the first terminal subassembly and the second terminal subassembly.

11. The electrical connector of claim 10, wherein:
the ground member comprises fingers extending from the metal strip.

12. The electrical connector of claim 1, wherein:
the ground member is a composite lossy member comprising a strip of electrically lossy material; and
the metal strip is disposed within the strip of lossy material.

13. The electrical connector of claim 12, wherein:
the composite lossy member is a first composite lossy member of a plurality of composite lossy members disposed between the first terminal subassembly and the second terminal subassembly.

14. An electrical connector comprising:
a housing comprising a cavity and a first slot and a second slot extending into the cavity in a first direction;
a first terminal subassembly comprising a first plurality of terminals held in a first row of terminals by a first insulative member;
a second terminal subassembly comprising a second plurality of terminals held in a second row of terminals;
a third terminal subassembly comprising a third plurality of terminals held in a third row of terminals; and
a fourth terminal subassembly comprising a fourth plurality of terminals held in a fourth row of terminals, wherein:
each of the first plurality of terminals, the second plurality of terminals, the third plurality of terminals, the fourth plurality of terminals comprises a mating portion, a tail and an intermediate portion joining the mating portion and the tail, the first terminal subassembly, the second terminal subassembly, the third terminal subassembly, and the fourth terminal subassembly are disposed within the cavity with the mating portions extending into a respective slot of the first slot and the second slot, the tails extend at a right angle from respective intermediate portions in four parallel rows in a plane parallel to the first direction, and the first insulative member comprises a first projection engaging the housing so as to block movement of the first terminal subassembly in the first direction and a second projection engaging the second insulative member so as to block movement of the second terminal subassembly in the first direction.

15. An electrical connector comprising:
a housing comprising a cavity and a first slot and a second slot extending into the cavity in a first direction;
a first terminal subassembly comprising a first plurality of terminals held in a first row of terminals;
a second terminal subassembly comprising a second plurality of terminals held in a second row of terminals;
a third terminal subassembly comprising a third plurality of terminals held in a third row of terminals; and
a fourth terminal subassembly comprising a fourth plurality of terminals held in a fourth row of terminals, wherein:
each of the first plurality of terminals, the second plurality of terminals, the third plurality of terminals, the fourth plurality of terminals comprises a mating portion, a tail and an intermediate portion joining the mating portion and the tail, the first terminal subassembly, the second terminal subassembly, the third terminal subassembly, and the fourth terminal subassembly are disposed within the cavity with the mating portions extending into a respective slot of the first slot and the second slot, the tails extend at a right angle from respective intermediate portions in four parallel rows in a plane parallel to the first direction, and the housing comprises an exterior face between the first slot and the second slot; and the exterior face comprises a plurality of openings therethrough.

16. The electrical connector of claim 15, wherein:
the housing between the exterior face and the cavity comprises a lattice defined by walls bounding the plurality of openings.

17. An electrical connector comprising:
a first plurality of terminals held in a first row;
a second plurality of terminals held in a second row parallel to the first row;
a third plurality of terminals held in a third row parallel to the first row;
a fourth plurality of terminals held in a fourth row parallel to the first row; and
a housing comprising a first slot and a second slot, each of the first and second slots extending in a direction parallel to the first row, the second row separated from the first slot in a direction perpendicular to the first row, wherein:
the first plurality of terminals and the second plurality of terminals are disposed in the first slot,
the third plurality of terminals and the fourth plurality of terminals are disposed in the second slot, each of the first plurality of terminals, the second plurality of terminals, the third plurality of terminals, the fourth plurality of terminals comprises a mating portion, a tail and an intermediate portion joining the mating portion and the tail, each intermediate portion comprises first and second parts, the connector comprises a first ground member between the first parts of the intermediate portions of the first and second plurality of terminals, and a second ground member between the second parts of the intermediate portions of the first and second plurality of terminals, and each of the first and second ground members comprises a strip of electrically lossy material.

18. An electrical connector comprising:

a first plurality of terminals held in a first row;

a second plurality of terminals held in a second row parallel to the first row;

a third plurality of terminals held in a third row parallel to the first row;

a fourth plurality of terminals held in a fourth row parallel to the first row; and a housing comprising a first slot and a second slot, each of the first and second slots extending in a direction parallel to the first row, the second row separated from the first slot in a direction perpendicular to the first row, wherein:

the first plurality of terminals and the second plurality of terminals are disposed in the first slot, the third plurality of terminals and the fourth plurality of terminals are disposed in the second slot, each of the first plurality of terminals, the second plurality of terminals, the third plurality of terminals, the fourth plurality of terminals comprises a mating portion, a tail and an intermediate portion joining the mating portion and the tail, each intermediate portion comprises first and second parts, the connector comprises a first ground member between the first parts of the intermediate portions of the first and second plurality of terminals, and a second ground member between the second parts of the intermediate portions of the first and second plurality of terminals, the first plurality of terminals comprise differential pairs of signal terminals separated by ground terminals, and the ground terminals of the first plurality of terminals are electrically connected to each other through at least one of the first and second ground members.

19. The electrical connector of claim 18, wherein:

the second plurality of terminals comprise differential pairs of signal terminals separated by ground terminals; and the ground terminals of the second plurality of terminals are electrically connected to the ground terminals of the first plurality of terminals through at least one of the first and second ground members.

20. An electrical connector comprising:

a first plurality of terminals held in a first row;

a second plurality of terminals held in a second row parallel to the first row;

a third plurality of terminals held in a third row parallel to the first row;

a fourth plurality of terminals held in a fourth row parallel to the first row; and a housing comprising a first slot and a second slot, each of the first and second slots extending in a direction parallel to the first row, the second row separated from the first slot in a direction perpendicular to the first row, wherein:

the first plurality of terminals and the second plurality of terminals are disposed in the first slot, the third plurality of terminals and the fourth plurality of terminals are disposed in the second slot, each of the first plurality of terminals, the second plurality of terminals, the third plurality of terminals, the fourth plurality of terminals comprises a mating portion, a tail and an intermediate portion joining the mating portion and the tail, each intermediate portion comprises first and second parts, the connector comprises a first ground member between the first parts of the intermediate portions of the first and second plurality of terminals, and a second ground member between the second parts of the intermediate portions of the first and second plurality of terminals, and a third ground member between the first parts of the intermediate portions of the third and fourth plurality of terminals.

21. The electrical connector of claim 20, wherein:

the third plurality of terminals comprise differential pairs of signal terminals separated by ground terminals;

the fourth plurality of terminals comprise differential pairs of signal terminals separated by ground terminals; and the ground terminals of the third plurality of terminals are electrically connected to each other and to the ground terminals of the fourth plurality of terminals through the third ground members.

* * * * *